US009840790B2

(12) United States Patent
Koukitu et al.

(10) Patent No.: US 9,840,790 B2
(45) Date of Patent: Dec. 12, 2017

(54) HIGHLY TRANSPARENT ALUMINUM NITRIDE SINGLE CRYSTALLINE LAYERS AND DEVICES MADE THEREFROM

(75) Inventors: Akinori Koukitu, Tokyo (JP); Yoshinao Kumagai, Tokyo (JP); Toru Nagashima, Yamaguchi (JP); Toru Kinoshita, Yamaguchi (JP); Yuki Kubota, Yamaguchi (JP); Rafael F. Dalmau, Raleigh, NC (US); Jinqiao Xie, Allen, TX (US); Baxter F. Moody, Raleigh, NC (US); Raoul Schlesser, Raleigh, NC (US); Zlatko Sitar, Apex, NC (US)

(73) Assignees: Hexatech, Inc., Morrisville, NC (US); National University Corporation Tokyo University of Agriculture and Technology, Tokyo (JP); Tokuyama Corporation, Yamaguchi (JP)

( * ) Notice: Subject to any disclaimer, the term of this patent is extended or adjusted under 35 U.S.C. 154(b) by 254 days.

(21) Appl. No.: 14/422,888

(22) PCT Filed: Aug. 23, 2012

(86) PCT No.: PCT/US2012/052022
§ 371 (c)(1),
(2), (4) Date: Feb. 20, 2015

(87) PCT Pub. No.: WO2014/031119
PCT Pub. Date: Feb. 27, 2014

(65) Prior Publication Data
US 2015/0247260 A1    Sep. 3, 2015

(51) Int. Cl.
*C30B 25/02*    (2006.01)
*C30B 25/20*    (2006.01)
(Continued)

(52) U.S. Cl.
CPC ............ *C30B 25/20* (2013.01); *C01B 21/072* (2013.01); *C30B 25/14* (2013.01); *C30B 25/165* (2013.01);
(Continued)

(58) Field of Classification Search
CPC ......... C30B 25/02; C30B 25/04; C30B 29/38; C23C 16/00; C23C 16/34
See application file for complete search history.

(56) References Cited

U.S. PATENT DOCUMENTS

| 5,523,589 A | 6/1996 | Edmond et al. |
| 5,592,501 A | 1/1997 | Edmond et al. |

(Continued)

FOREIGN PATENT DOCUMENTS

| JP | 2005-343705 | 12/2005 |
| JP | 2006-16294 | 1/2006 |

(Continued)

OTHER PUBLICATIONS

Crystal IS, "Optan (data sheet)," www.cisuvc.com, 2014, 8 pages.
(Continued)

*Primary Examiner* — Robert M Kunemund
(74) *Attorney, Agent, or Firm* — Womble Bond Dickinson (US) LLP

(57) ABSTRACT

The invention provides highly transparent single crystalline AlN layers as device substrates for light emitting diodes in order to improve the output and operational degradation of light emitting devices. The highly transparent single crystalline AlN layers have a refractive index in the a-axis direction in the range of 2.250 to 2.400 and an absorption coefficient less than or equal to 15 cm-1 at a wavelength of 265 nm. The invention also provides a method for growing highly transparent single crystalline AlN layers, the method including the steps of maintaining the amount of Al con-
(Continued)

tained in wall deposits formed in a flow channel of a reactor at a level lower than or equal to 30% of the total amount of aluminum fed into the reactor, and maintaining the wall temperature in the flow channel at less than or equal to 1200° C.

9 Claims, 7 Drawing Sheets

(51) Int. Cl.
    *C30B 25/14* (2006.01)
    *C30B 29/40* (2006.01)
    *H01L 33/00* (2010.01)
    *H01L 33/32* (2010.01)
    *H01L 33/02* (2010.01)
    *C30B 25/16* (2006.01)
    *C01B 21/072* (2006.01)
    *H01L 33/18* (2010.01)

(52) U.S. Cl.
    CPC ........ *C30B 29/403* (2013.01); *H01L 33/0075* (2013.01); *H01L 33/02* (2013.01); *H01L 33/18* (2013.01); *H01L 33/32* (2013.01); *C01P 2006/60* (2013.01); *Y10T 428/26* (2015.01)

(56) References Cited

U.S. PATENT DOCUMENTS

| | | | |
|---|---|---|---|
| 6,045,612 A | 4/2000 | Hunter | |
| 6,066,205 A | 5/2000 | Hunter | |
| 6,110,424 A | 8/2000 | Maiden et al. | |
| 6,296,956 B1 | 10/2001 | Hunter | |
| 6,579,495 B1 | 6/2003 | Maiden | |
| 6,690,035 B1 | 2/2004 | Yokogawa et al. | |
| 6,888,170 B2 | 5/2005 | Schaff et al. | |
| 6,953,740 B2 | 10/2005 | Schaff et al. | |
| 7,501,023 B2 * | 3/2009 | Dmitriev | C30B 25/00 117/106 |
| 7,632,454 B2 | 12/2009 | Schlesser et al. | |
| 7,678,195 B2 | 3/2010 | Schlesser et al. | |
| 7,678,198 B2 | 3/2010 | Hartig | |
| 7,815,970 B2 | 10/2010 | Schlesser et al. | |
| 7,915,178 B2 | 3/2011 | Collazo et al. | |
| 8,080,833 B2 | 12/2011 | Grandusky et al. | |
| 8,123,859 B2 | 2/2012 | Schowalter et al. | |
| 8,222,650 B2 | 7/2012 | Schowalter et al. | |
| 8,455,909 B2 | 6/2013 | Negley | |
| 8,545,629 B2 | 10/2013 | Schowalter et al. | |
| 2002/0028291 A1 * | 3/2002 | Shibata | C30B 25/02 427/255.39 |
| 2005/0000913 A1 | 1/2005 | Betterly | |
| 2006/0138443 A1 | 6/2006 | Fan et al. | |
| 2006/0163126 A1 | 7/2006 | Maiden | |
| 2006/0216193 A1 | 9/2006 | Johnson et al. | |
| 2007/0029558 A1 | 2/2007 | Nishizono | |
| 2007/0086912 A1 | 4/2007 | Dowling et al. | |
| 2007/0096239 A1 | 5/2007 | Cao et al. | |
| 2007/0101932 A1 | 5/2007 | Schowalter et al. | |
| 2007/0131160 A1 | 6/2007 | Slack et al. | |
| 2007/0131872 A1 | 6/2007 | Shearer et al. | |
| 2007/0134827 A1 | 6/2007 | Bondokov et al. | |
| 2007/0159067 A1 | 7/2007 | Yun et al. | |
| 2007/0206164 A1 | 9/2007 | Beeson et al. | |
| 2007/0243653 A1 | 10/2007 | Morgan et al. | |
| 2007/0257333 A1 | 11/2007 | Schlesser et al. | |
| 2008/0003649 A1 | 1/2008 | Maltezos et al. | |
| 2008/0083970 A1 | 4/2008 | Kamber et al. | |
| 2008/0087914 A1 | 4/2008 | Li et al. | |
| 2008/0132040 A1 | 6/2008 | Wang et al. | |
| 2008/0182092 A1 | 7/2008 | Bondokov et al. | |
| 2008/0187016 A1 | 8/2008 | Schowalter et al. | |
| 2008/0199353 A1 | 8/2008 | Mlodzinski et al. | |
| 2009/0084734 A1 | 4/2009 | Yencho | |
| 2009/0250626 A1 | 10/2009 | Schlesser et al. | |
| 2010/0032682 A1 | 2/2010 | Zimmerman et al. | |
| 2010/0207166 A1 | 8/2010 | Zhu | |
| 2010/0237254 A1 | 9/2010 | Mason et al. | |
| 2010/0242835 A1 | 9/2010 | Arena et al. | |
| 2010/0264460 A1 | 10/2010 | Grandusky et al. | |
| 2010/0301490 A1 | 12/2010 | Simin et al. | |
| 2010/0314551 A1 | 12/2010 | Bettles et al. | |
| 2011/0133262 A1 | 6/2011 | Wahl et al. | |
| 2011/0198643 A1 | 8/2011 | Kim | |
| 2012/0000414 A1 | 1/2012 | Bondokov et al. | |
| 2012/0240845 A1 | 9/2012 | Fukuyama et al. | |
| 2013/0168689 A1 | 7/2013 | Lee | |
| 2014/0239305 A1 | 8/2014 | Shah et al. | |

FOREIGN PATENT DOCUMENTS

| | | |
|---|---|---|
| JP | 2006 278 570 | 10/2006 |
| JP | 2006 290 662 | 10/2006 |
| JP | 2008-19130 | 1/2008 |
| JP | 2010 042950 | 2/2010 |
| JP | 4565042 | 10/2010 |
| WO | WO 2008/042020 | 4/2008 |
| WO | WO 2009/090821 | 7/2009 |
| WO | WO 2009/090923 | 7/2009 |
| WO | WO 2010/001803 | 1/2010 |
| WO | WO 2010/122933 | 10/2010 |

OTHER PUBLICATIONS

Kitamura et al., "Reliability and Lifetime of Pseudomorphic UVC LEDs on AlN Substrate Under Various Stress Condition," *IEEE Lester Eastman Conference on High Performance Devices (LEC)*, 2014, 5 pages.
OSRAM Opto Semiconductors, "Reliability and Lifetime of LEDS," (brochure) 2013, pp. 1-14.
Sensor Electronic Technology, Inc., "Sensor Electronic Technology, Inc. achieves more than 10,000 hours lifetime on UVTOP® ultra-violet LEDS," (press release) 2011, 1 page.
US Department of Energy, Energy Efficiency and Renewable Energy, "Lifetime of White LEDS," Building Technologies Program (brochure), 2009, 2 pages.
Wunderer, et al., "Optically pumped UV lasers grown on bulk AlN substrates," *Phys. Status Solidi C*, 2012, pp. 1-4, vol. 9, Nos. 3-4.
Alevli et al., "The Influence of N2/H2 and Ammonia N Source Materials on Optical and Structural Properties of AlN Films Grown by Plasma Enhanced Atomic Layer Deposition," *Journal of Crystal Growth*, 2011, pp. 51-57, vol. 335.
Bettles et al., "UV Light Emitting Diodes Their Applications and Benefits," *IUVA News*, vol. 9, No. 2, Jun. 2007, pp. 11-15.
Collazo et al. (2011) "Progress on n-type doping of AlGaN alloys on AlN single crystal substrates for UV optoelectronic applications," *Physica Status Solidi C-Current Topics in Solid State Physics*, vol. 8, pp. 7-8.
Collazo et al. "265 nm light emitting diodes on AlN single crystal substrates: Growth and characterization," (2011 Conference on Lasers and Electro-Optics (CLEO)), 2011.
Collazo et al., "On the Origin of the 265 nm Absorption Band in AlN Bulk Crystals," *Appl. Phys. Lett*, 100, 2012, pp. 191914-1-191914-5.
Dalmau et al. "Characterization of dislocation arrays in AlN single crystals grown by PVT," *Phys. status solidi A* 2011, 208 (7), 1545-7.
Dalmau et al. "Growth and characterization of AlN and AlGaN epitaxial films on AlN single crystal substrates," *Journal of the Electrochemical Society*, 2011, 158(5), H530-H535.
Ehrentraut, et al. "Advances in bulk crystal growth of AlN and GaN," *MRS Bulletin*, 2009, vol. 34, (4), 259-265.
Figge et al., "Temperature Dependence of the Thermal Expansion of AlN," *Applied Physics Letters*, 2009, 101915-1 to 101915-3, vol. 94.
Herro et al. "Growth of AlN single crystalline boules," *Journal of Crystal Growth*, 2010, 312 (18) pp. 2519-2521.

(56) References Cited

OTHER PUBLICATIONS

Grandusky et al. "Performance and reliability of ultraviolet-C pseudomorphic light emitting diodes on bulk AlN substrates," *Phys. Status Solidi C*, 2010, vol. 7, pp. 2199-2201.

Kumagai et al., "Preparation of a Freestanding AlN Substrate from a Thick AlN Layer Grown by Hydride Vapor Phase Epitaxy on a Bulk AIS Substrate Prepared by Physical Vapor Transport," *Applied Physics Express*, 5, 2012, pp. 055504-1-055504-3.

Lu et al., "Seeded growth of AlN bulk crystals in m- and c-orientation," *Journal of Crystal Growth*, 2009, 312(1), 58-63.

Mueller et al., "The Progress of AlN Bulk Growth and Epitaxy for Electronic Applications," *Phys. Status Solidi A*, 2009, pp. 1-7.

Nagashima et al., "Structural and Optical Properties of Carbon-Doped AlN Substrates Grown by Hydride Vapor Phase Epitaxy Using AlN Substrates Prepared by Physical Vapor Transport," *Applied Physics Express*, 2012, vol. 5, pp. 125501-1 to 125501-3.

Raghothamachar et al., "X-ray Characterization of Bulk AlN Single Crystals Grown by the Sublimation Technique," *Journal of Crystal Growth*, 2003, pp. 244-250, vol. 250.

Raghothamachar et al. "Low defect density bulk AlN substrates for high performance electronics and optoelectronics," *Materials Science Forum*, 2012, vols. 717-720, pp. 1287-1290.

Rojo et al., "Report on the Growth of Bulk Aluminum Nitride and Subsequent Substrate Preparation," *Journal of Crystal Growth*, 2001, pp. 317-321, vol. 231.

Schlesser et al., "Seeded Growth of AlN Bulk Crystals by Sublimation," *Journal of Crystal Growth*, 2002, pp. 416-420, vol. 241.

Schowalter et al., "Preparation and Characterization of Single-Crystal Aluminum Nitride Substrates," *Mat. Res. Soc. Symp.*, vol. 595, pp. W6.7.1-W6.7.6.

Tweedie et al., "Schottky Barrier and Interface Chemistry for Ni Contacted to $Al_{0.8}Ga_{0.2}N$ Grown On C-Oriented AlN Single Crystal Substrates," *Phys. Status Solidi C9*, 2012, vol. 9, No. 3-4, pp. 584-587.

Weiwei et al., "Wet Etching and Infrared Absorption of AlN Bulk Single Crystals," *Journal of Semiconductors*, 2009, pp. 073002-1 to 073002-4, vol. 30, No. 7.

Xie et al., "Ni/Au Schottky Diodes on $Al_xGa_{1-x}N$ ($0.7<x<1$) Grown on AlN Single Crystals Substrates," *Phys. Status Solidi C8*, 2011, vol. 8, No. 7-8, pp. 2407-2409.

Jiang, W., et al., "Optical anisotropy of AlN epilayer on sapphire substrate investigated by variable-angle spectroscopic ellipsometry," *Optical Materials*, Jul. 2010, pp. 891-895, vol. 32(9).

Roskovcova, I. et al. "The Dispersion of the Refractive Index and the Birefringence of AlN," *Physica Status Solidi* (b), 1967, pp. K29-K32, vol. 20(1).

* cited by examiner

| | Thickness | Inclusion | Substrate lattice constant | $a_1$ | AlN layer lattice constant | $a_2$ | $\|a_1-a_2\|/a_1$ | AlN layer total impurity conc. | Refractive index (a-axis) | Refractive index (c-axis) | Refractive index difference (c-axis-a-axis) | Absorption coefficient | XRC |
|---|---|---|---|---|---|---|---|---|---|---|---|---|---|
| | μm | cm$^{-2}$ | nm | nm | nm | nm | ppm | cm$^{-3}$ | | | | cm$^{-1}$ | arcsec |
| Practical Example 1 | 300 | 10 | 0.311092 0.311112 0.311092 0.311105 0.311094 | 0.311099 | 0.311111 0.311087 0.311119 0.311106 0.311113 | 0.311107 | 26 | 9.1E+16 | 2.325 (250nm) 2.276 (265nm) | 2.383 (250nm) 2.330 (265nm) | 0.058 (250nm) 0.054 (265nm) | 13 (250nm) 12 (265nm) | 1200 |
| Practical Example 2 | 320 | 2 | 0.311115 0.311097 0.311098 0.311090 0.311089 | 0.311098 | 0.311101 0.311086 0.311118 0.311119 0.311090 | 0.311103 | 16 | 1.E+17 | 2.391 (250nm) 2.336 (265nm) | 2.491 (250nm) 2.424 (265nm) | 0.100 (250nm) 0.088 (265nm) | 7.0 (250nm) 6.6 (265nm) | 25 |
| Practical Example 3 | 240 | 15 | 0.311115 0.311097 0.311098 0.311090 0.311089 | 0.311098 | 0.311149 0.311088 0.311121 0.311059 0.311095 | 0.311102 | 13 | 3.E+17 | 2.385 (250nm) 2.329 (265nm) | 2.478 (250nm) 2.409 (265nm) | 0.093 (250nm) 0.080 (265nm) | 9.6 (250nm) 9.0 (265nm) | 103 |
| Practical Example 4 | 340 | 1 | 0.311115 0.311097 0.311098 0.311090 0.311089 | 0.311098 | 0.311095 0.311086 0.311092 0.311102 0.311089 | 0.311093 | 16 | 3.E+18 | 2.382 (250nm) 2.326 (265nm) | 2.492 (250nm) 2.422 (265nm) | 0.110 (250nm) 0.096 (265nm) | 13 (250nm) 10 (265nm) | 32 |

| | Thickness | Inclusion | Substrate lattice constant | $a_1$ | AlN layer lattice constant | $a_2$ | $|a_1-a_2|/a_1$ | AlN layer total impurity conc. | Refractive index (a-axis) | Refractive index (c-axis) | Refractive index difference (c-axis-a-axis) | Absorption coefficient | XRC |
|---|---|---|---|---|---|---|---|---|---|---|---|---|---|
| | μm | cm$^{-2}$ | nm | nm | nm | nm | ppm | cm$^{-3}$ | | | | cm$^{-1}$ | arcsec |
| Comparative Example 1 | 290 | 80 | 0.311115<br>0.311097<br>0.311098<br>0.311090<br>0.311089 | 0.311098 | 0.311069<br>0.311112<br>0.310968<br>0.311094<br>0.311105 | 0.311070 | 90 | 2.E+17 | 2.293 (250nm)<br>2.241 (265nm) | 2.341 (250nm)<br>2.280 (265nm) | 0.048 (250nm)<br>0.039 (265nm) | 13 (250nm)<br>10 (265nm) | 240 |
| Comparative Example 2 | 120 | 100 | 0.311115<br>0.311097<br>0.311098<br>0.311090<br>0.311089 | 0.311098 | 0.311063<br>0.311061<br>0.311067<br>0.311062<br>0.311059 | 0.311062 | 116 | 5.E+16 | 2.251 (250nm)<br>2.216 (265nm) | 2.289 (250nm)<br>2.247 (265nm) | 0.038 (250nm)<br>0.031 (265nm) | 60 (250nm)<br>47 (265nm) | 3200 |
| Comparative Example 3 | 250 | 2 | 0.311115<br>0.311097<br>0.311098<br>0.311090<br>0.311089 | 0.311098 | 0.311072<br>0.311083<br>0.311068<br>0.311101<br>0.311076 | 0.311080 | 58 | 3.E+19 | 2.411 (250nm)<br>2.366 (265nm) | 2.474 (250nm)<br>2.425 (265nm) | 0.063 (250nm)<br>0.059 (265nm) | 2722 (250nm)<br>1650 (265nm) | 65 |

HIGHLY TRANSPARENT ALUMINUM NITRIDE SINGLE CRYSTALLINE LAYERS AND DEVICES MADE THEREFROM

FIELD OF THE INVENTION

The present invention relates to highly transparent single crystalline aluminum nitride (AlN) layers, stacks comprising such layers, and light emitting diodes (LEDs) comprising such layers as device substrates.

BACKGROUND OF THE INVENTION

Among the III-nitride semiconductors, single crystalline AlN is a material that features a direct bandgap of about 6 eV. In addition, as AlN has a larger bandgap than other nitrides such as GaN and InN, it is possible to engineer the bandgap energy through alloying of AlN with Ga or In. As a consequence, III-nitride semiconductors enable short wavelength light emission in the ultraviolet (UV) spectral range and are expected to be utilized for the fabrication of white light LEDs, UV-LEDs for sterilization applications, lasers for high-density optical disc storage applications, and light emitting sources for laser communications. To form semiconductor devices such as light emitting devices, it is necessary to form a multilayer structure including active layers between an n-type semiconductor layer electrically connected to an n-electrode and a p-type semiconductor layer electrically connected to a p-electrode. It is important for all layers to have high crystallinity, i.e., to have few dislocations and point defects that could adversely affect light emission efficiency.

Sapphire substrates are often used for III-nitride based LEDs from the viewpoint of stable supply, cost, and UV transparency. It is possible to obtain III-nitride semiconductor devices by using highly transparent sapphire as a substrate. However, due to the fact that there is a difference in lattice constant between the III-nitride LED device layers and the sapphire substrate, a large density of dislocations of about $10^9$ $cm^{-2}$ is generated at the interface between the substrate and the device structure, and it is a known problem in the art that this elevated dislocation density adversely affects the light emission efficiency and the lifetime of LED devices. Therefore, it is desirable to use AlN or GaN single crystals as substrates for III-nitride based LEDs, since the use of these native III-nitride substrates minimizes the difference in lattice constant between substrate and device layers. In addition, since dislocations present in the substrate tend to propagate into the device layers, the use of III-nitride substrates with low dislocation density is desirable. Furthermore, as AlN and GaN substrates possess high thermal conductivity, they help dissipate the Joule heat generated by the process of current injection in the light emitting layers. It is understood that heat dissipation enhances device lifetime. In particular, the use of AlN as a substrate has been reduced to practice.

The following production method is known for AlN single crystals with low dislocation density, which are desirable for the aforementioned applications. First, an AlN substrate is prepared from an AlN single crystal grown using a sublimation method, and then serves as a seed crystal substrate. Subsequently, a single crystalline AlN layer is deposited on the AlN substrate by hydride vapor phase epitaxy (HVPE). Thereafter, the HYPE-grown single crystalline AlN layer is separated from the original substrate, and the HVPE-grown single crystalline AlN layer then serves as a substrate for the fabrication of light emitting devices (see Japanese Pat. Appl. Pub. No. 2006-16294).

The main incentive to form a semiconductor layer (e.g., an AlN single crystalline layer) on a sublimation-grown AlN substrate by HVPE consists of the fact that the impurity levels can be easily controlled during HVPE growth. For example, when an AlN layer is grown by HYPE, it is relatively easy to reduce the level of impurities originating from structural elements of the reactor, since the crystal growth temperature in an HYPE reactor is much lower than in a sublimation growth reactor. As a result of lower contamination levels, it is possible to enhance the optical transparency of single crystalline AlN layers. In addition, when the single crystalline AlN layer is intentionally doped with dopants such as silicon in order to impart conductivity, the desired dopant concentration can easily be controlled by supplying a source of dopants along with the precursors for AlN.

When compared to generally similar vapor phase epitaxy methods, HVPE offers additional advantages. For example, when compared with a vapor phase epitaxy process such as MOCVD (metalorganic chemical vapor deposition), the HVPE method offers higher growth rates of single crystalline AlN layers since higher concentrations of precursors for AlN can be supplied.

Therefore, by using the HVPE method, it is possible to deposit single crystalline AlN layers with desirable optical properties and electrical characteristics at relatively high productivity levels. However, according to the studies performed by the inventors, when producing semiconductor devices (LEDs) according to Japanese Pat. Appl. Pub. No. 2006-16294, it was found that there was room for improvement. In particular, when LEDs were fabricated on the single crystalline AlN layers prepared according to the HYPE growth procedure described in Japanese Pat. Appl. Pub. No. 2006-16294, it was found that only part of the LEDs exhibited acceptable emission characteristics, while other LEDs suffered from low optical output or device failure.

In addition to the production method discussed thus far, a modified HVPE method for the production of single crystalline AlN layers of higher crystallinity was devised. Specifically, combining reactor heating from the outside with additional, local heating of the seed crystal substrate enables higher growth temperatures, which, in turn, enable the formation of highly crystalline AlN layers (see Japanese Pat. Appl. Pub. Nos. 2005-343705 and 2008-19130). However, LEDs fabricated on single crystalline AlN layers obtained by this improved method still showed some performance issues in terms of low optical output and device failure.

In comparison with the HVPE method described above, the sublimation method is known to obtain highly crystalline and highly transparent AlN (see, for example, WO 2010/001803). According to this method, it is possible to produce high-quality AlN with low dislocation density and residual impurity level. However, AlN obtained by this method showed a high refractive index, probably due to the production method, and thus is too highly reflective for use as a substrate for LEDs. As a consequence, there remains room for improvement in terms of light extraction efficiency. In addition, single crystalline AlN layers grown by this method showed as a particular characteristic that the transparency becomes particularly poor as the refractive index decreases.

Although the crystal described by Roskovcová et al. (Physica Status Solidi (b), 20, K29 (1967)) has lower refractive index than the AlN single crystal described in WO 2010/001803, there is a strong absorption band between the band edge of AlN and a wavelength of about 300 nm. Therefore, this AlN single crystal cannot be used as a substrate for UV-LEDs. Similarly, crystals with lower refractive index than the AlN single crystal described in WO 2010/001803 are reported by Jiang et al. (Optical Materials, 32, 891 (2010)). The AlN single crystals described by Jiang et al. are films grown on the surface of sapphire substrates, and it is, therefore, straightforward to predict that a large number of dislocations will have formed due to the lattice mismatch between the sapphire substrate and the AlN single crystal. Furthermore, it appears that there is strong absorption in the deep UV region, and thus this material cannot be used as a substrate for deep-UV LEDs.

Accordingly, there remains a need in the art for highly transparent single crystalline AlN layers that contribute to the improvement of optical light output and to the reduction of device failure of light emitting devices, meaning the highly transparent single crystalline AlN layers are useful as device substrates for LEDs.

SUMMARY OF THE INVENTION

The inventors conducted extensive studies to solve the problems described above. First, the inventors investigated correlations between the properties of single crystalline AlN layers formed by HVPE on a substrate, and the observed device failures of the LEDs grown on these HVPE layers.

In cases where optical power decline and LED device failure happened frequently, the inventors found that the refractive index of the single crystalline AlN layers tended to be low. Furthermore, the inventors found that the anisotropy of the refractive index tended to be small as well. Then, when increasing the refractive index to some extent, it was found that the difference between the average value of the in-plane lattice constant of the single crystalline AlN layer and that of the substrate needed to be kept small in order to produce single crystalline AlN layers with high transparency and low reflectance. In addition, it was found that single crystalline AlN layers with lower refractive index and a large difference between the average values of the lattice constants contained a high density of inclusions.

As a consequence, the inventors tried to determine the specific range of refractive index values of single crystalline AlN layers required to obtain improved characteristics of LEDs formed on these layers as underlying substrates. Furthermore, a method for reducing the amount of inclusions formed during the growth of single crystalline AlN layers was found, and as a result, the inventors completed this invention.

In one aspect, the present invention provides highly transparent single crystalline AlN layers having a refractive index in the a-axis direction ranging from 2.250 to 2.400 and an absorption coefficient lower than or equal to 15 cm$^{-1}$ at a wavelength of 265 nm. In certain embodiments, highly transparent single crystalline AlN layers according to the invention, when used as device substrates, lead to improved optical output and reduced failure of light emitting devices. As a consequence, highly transparent single crystalline AlN layers of the invention used as device substrates can lead to an improvement in device lifetime and operational reliability of light emitting devices.

It is desirable that the highly transparent single crystalline AlN layers have a larger refractive index in the c-axis direction than in the a-axis direction and that the difference between both refractive indices be kept between 0.05 to 0.15 at a wavelength of 265 nm. Furthermore, it is desirable that the highly transparent single crystalline AlN layers have a density of defects, originating from inclusions with maximum outer diameter from 1 μm to 200 μm, of less than or equal to 50 cm$^{-2}$, that the principal surface area is larger than or equal to 100 mm$^2$, and that the layer thickness ranges from 0.05 to 2.0 mm. In addition, it is desirable that the highly transparent single crystalline AlN layers are of high purity such that the sum of Si, O, C, and B impurity concentrations remains below or equal to 1×10$^{19}$ cm$^{-3}$. In preferred embodiments, the highly transparent single crystalline AlN layer is formed by hydride vapor phase epitaxy.

In another aspect, the invention provides a layer stack formed of at least one highly transparent single crystalline AlN layer according to the invention deposited on a base substrate prepared from an AlN single crystal and having an AlN single crystalline surface. In addition, it is advantageous for the average lattice constant of the AlN single crystal substrate and that of the highly transparent single crystalline AlN layer, which are represented as $a_1$ and $a_2$, respectively, be characterized in that the value indicated by $|a_1-a_2|/a_1$ is less than or equal to 90 ppm.

Still further, the invention provides light emitting diodes comprising a highly transparent single crystalline AlN layer of the invention as a device substrate.

In yet another aspect, the invention provides a method for growing highly transparent single crystalline AlN layers. The method comprises supplying an aluminum chloride gas from a supply nozzle and a nitrogen precursor gas from a supply nozzle to a reactor having walls, wherein a portion of the walls of the reactor form a flow channel segment defined as the walls of the reactor from 200 mm upstream to 200 mm downstream of the location of a tip of the aluminum chloride gas supply nozzle; and reacting the aluminum chloride gas with the nitrogen precursor gas on a substrate in the reactor in order to grow an AlN single crystalline layer on the substrate. During the reacting step, the amount of aluminum contained in wall deposits formed in the flow channel segment is maintained at a level lower than or equal to 30% of the total amount of aluminum fed into the reactor, and the wall temperature in the flow channel is maintained at less than or equal to 1200° C. The method can further include the steps of supplying a carrier gas to the flow channel of the reactor and directing the carrier gas toward the substrate, the carrier gas being supplied around the supply nozzles for the aluminum chloride gas and the nitrogen precursor gas. The carrier gas preferably passes through a baffle plate comprising a plurality of holes.

BRIEF DESCRIPTION OF THE DRAWINGS

Figure 1:
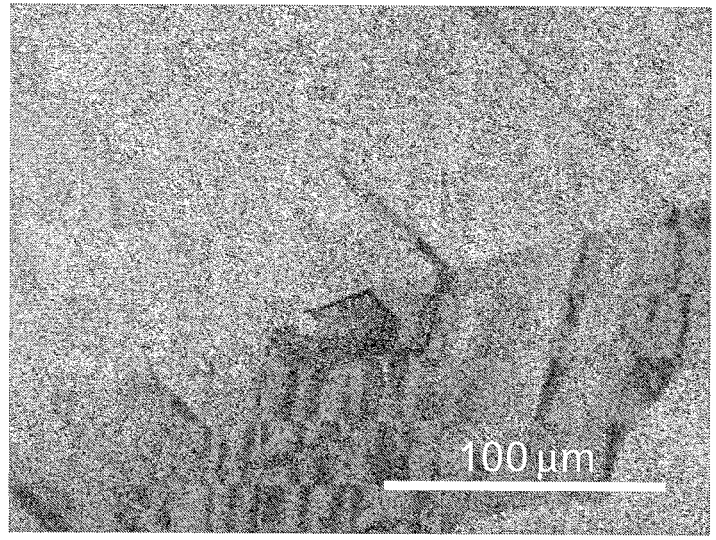
Figure 2:
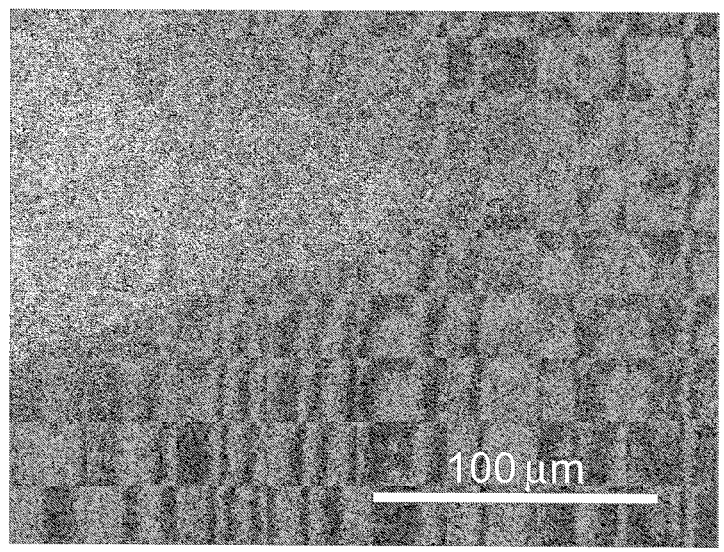
Figure 3:
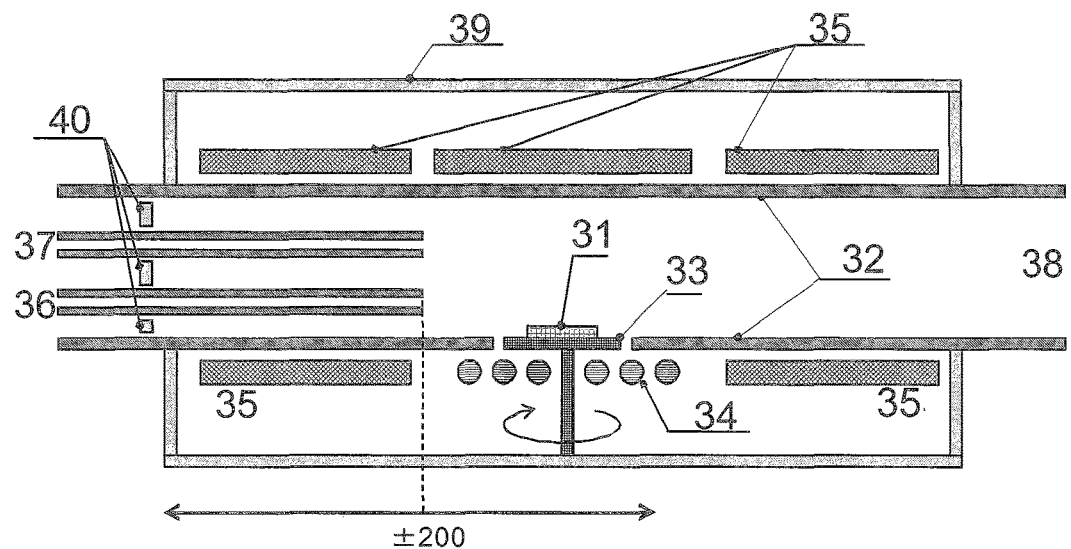
Figure 4:
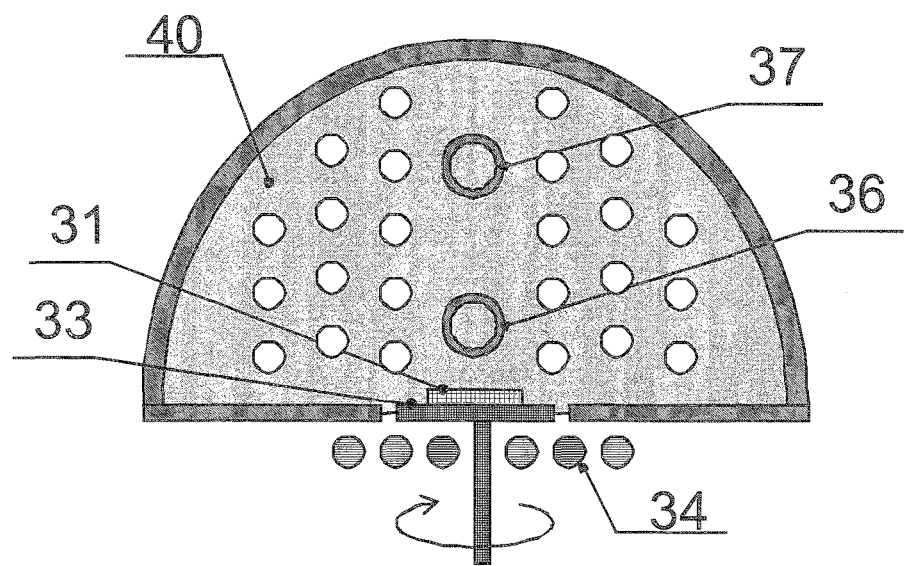
Figure 5:
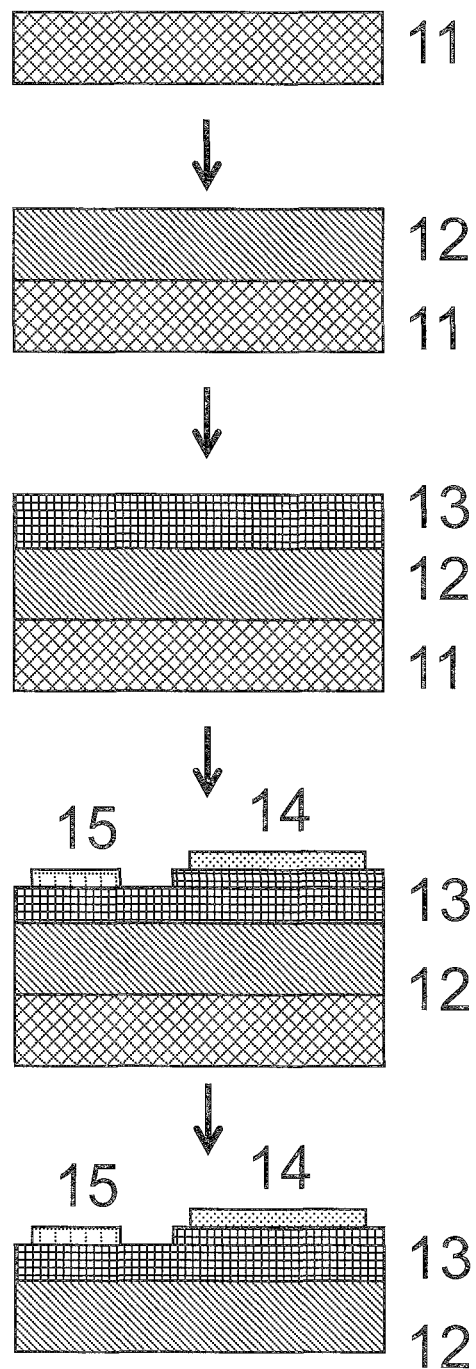
Figure 6:
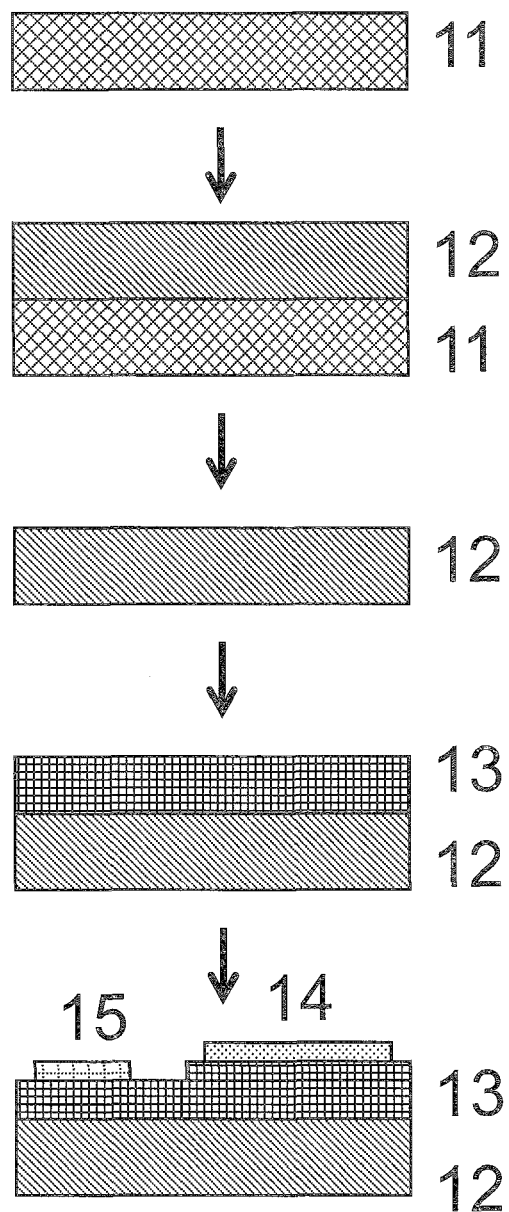
Figure 7:
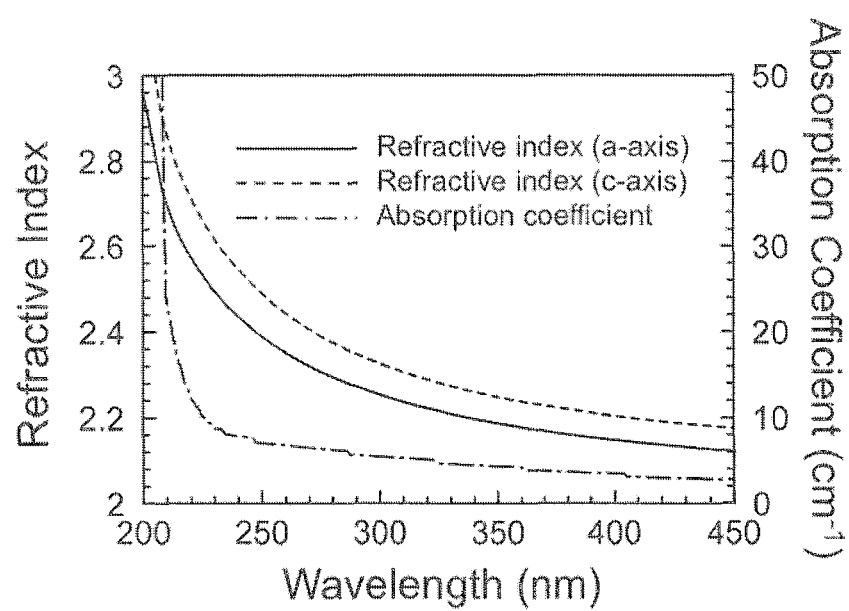

Having thus described the disclosure in general terms, reference will now be made to the accompanying drawings, which are not necessarily drawn to scale, and wherein:

FIG. 1 is a 500× magnification bright field image of hillocks originating from inclusions in a single crystalline AlN layer observed by Nomarski differential interference optical microscopy;

FIG. 2 is a 500× magnification bright field image of the surface area of a single crystalline AlN layer without inclusions observed by Nomarski differential interference optical microscopy;

FIG. 3 is a schematic diagram of the structure of a horizontal HVPE apparatus suitable for the deposition of the layers of the present invention;

FIG. 4 is a schematic diagram of a bulkhead modification as seen from the downstream side of a horizontal HYPE apparatus;

FIG. 5 is a schematic process flow for fabrication of light emitting devices, including the substrate, deposition of a single crystalline AlN layer, formation of light emitting device layers on the single crystalline AlN layer, and removal of the original substrate;

FIG. 6 is a schematic process flow for fabrication of light emitting devices on a freestanding AlN layer, including the substrate, deposition of a single crystalline AlN layer, removal of the original substrate, and formation of light emitting device layers on the single crystalline AlN layer;

FIG. 7 graphically illustrates the wavelength dependence of the absorption coefficient and the refractive indices of a single crystalline AlN layer;

FIG. 8 presents a summary of data from Practical Examples 1 through 4; and

FIG. 9 presents a summary of data from Comparative Examples 1 through 3.

DETAILED DESCRIPTION OF THE INVENTION

The present disclosure now will be described more fully hereinafter with reference to certain preferred aspects. These aspects are provided so that this disclosure will be thorough and complete, and will fully convey the scope of the disclosure to those skilled in the art. Indeed, the disclosure may be embodied in many different forms and should not be construed as limited to the aspects set forth herein; rather, these aspects are provided so that this disclosure will satisfy applicable legal requirements. As used in the specification, and in the appended claims, the singular forms "a", "an", "the", include plural referents unless the context clearly dictates otherwise.

I. Highly Transparent Single Crystalline AlN Layers

Highly transparent single crystalline AlN layers of the invention have a refractive index in the a-axis direction ranging from 2.250 to 2.400 and an absorption coefficient lower than or equal to 15 cm$^{-1}$ at a wavelength of 265 nm. In this invention, and in order to demonstrate suitability for the fabrication of deep-UV LEDs, all references to the refractive index and the absorption coefficient are understood to refer to a wavelength of 265 nm. Therefore, unless otherwise specified, the refractive index and the absorption coefficient will be given at a wavelength of 265 nm in the following. The refractive index along the c-axis direction is given at 23° C. and at a wavelength of 265 nm.

Refractive indices along a- and c-axis directions, as well as the absorption coefficient can be measured by spectroscopic ellipsometry. More specifically, the following measurement equipment and procedure is preferable. A J. A. Woollam Co., Inc, M-2000D high speed ellipsometer with multi-incident angles and rotating compensator is preferably used as a spectroscopic ellipsometer. Halogen and deuterium lamps are used as light sources to measure the spectral range from 200 nm to 1000 nm. For these measurements, a rotating compensator is inserted in the upstream area of the optical system. A linearly polarized light beam is created. It irradiates the sample to be measured by condensing the incident light beam to a diameter of about 0.3 mm. The polarized light, which is reflected from the sample, is received by a CCD detector and the amplitude ratio and phase difference change is observed. The measurement is carried out for at least three incident angles such as 65, 70, and 75 degrees, and at least two polarization angles such as 0 and 90 degrees. For polarization angles, more preferably, four angles of 0, 45, 90 and 135 degrees are measured.

After measuring the sample by spectroscopic ellipsometry, an analytical model is applied to the measured data, and simulations of the amplitude ratio and phase difference of the reflected light are carried out according to the analytical model. This analysis compares the measured data to a model of the wavelength dependence of amplitude ratio and phase difference, with the goal to fit the model to the measured data over the entire wavelength region through optimization of the model parameters for the optical constants (refractive indices of the c-axis and a-axis directions, and the extinction coefficient) and the film thickness. The parameters that produce the closest fit between the measured data and the model data are then taken as the optimal solution. The J. A. Woollam Co., Inc. CompleteEase™ software can be used as analysis software.

In the analysis above, the analytical model considers a stack of three layers comprising a single crystalline AlN layer, and rough layers on top and bottom of the substrate. Because fine roughness, such as polishing scratches, exists on the measured sample surface, the refractive index can be calculated more accurately by including a roughness layer in the model. The roughness layer is assumed as a mixed layer of AlN and air at a ratio of 1:1. In the analytical model, the thickness of this hypothetical roughness layer reflects the degree of surface roughness.

The surface of the sample is polished to an optical-quality finish in order to minimize light scattering on the surface. The surface of the sample should be polished to at least a mirror-like finish by mechanical or chemo-mechanical polishing. Samples with a mirror-like finish will yield a modeled roughness layer thickness ranging from 0 to 15 nm.

In addition, in order to improve the accuracy of the results, the above analysis is complemented by an independent measurement of transmittance using non-polarized light over the same wavelength range as measured by spectroscopic ellipsometry.

Although there are no particular limitations on the sample thickness, the sample thickness is measured and typically ranges from 50 μm to 300 μm. In addition, the a-direction of the sample and the off-cut angle of the crystal axes with respect to the sample surface are measured in advance, and these measurements are included in the analytical model. For c-plane substrates, the sample is polished such that the off-cut angle is smaller than or equal to 1°. This preparation specification is intended to render the optical analysis as accurate as possible.

The extinction coefficient (k) can be derived from the spectroscopic ellipsometry data as has been mentioned above. When the extinction coefficient and the wavelength are k and λ, respectively, the optical absorption coefficient α of the single crystalline AlN layer can be calculated by Equation 1 below:

$$\alpha = 4\pi k/\lambda,  \quad \text{(Equation 1)}$$

where α is the absorption coefficient used in the present invention.

If the refractive index of single crystalline AlN layers in the a-axis direction is lower than 2.250, the single crystalline AlN layer does not represent a substrate of preferred quality, since LED devices will typically be affected by low optical light output or device failure. According to the inventors' research, single crystalline AlN layers with a refractive index lower than 2.25 in the a-axis direction contain a high dislocation density and a large number of inclusions. When this type of substrate is used for LED fabrication, it is thought that low optical light output and device failures are caused by the presence of dislocations and inclusions. The presence of inclusions causes additional adverse effects, which will be described in detailed below.

On the other hand, if the refractive index of single crystalline AlN layers in the a-axis direction is greater than 2.400, optical reflectivity gets excessively high. This is not desirable as the light extraction efficiency will be reduced.

Considering the achievable optical output, device stability and light extraction efficiency of LEDs, the refractive index along the a-axis direction of single crystalline AlN layers preferably ranges from 2.280 to 2.390, and more preferably, from 2.300 to 2.380.

The absorption coefficient of AlN formed according to the present invention is lower than or equal to 15 cm$^{-1}$. If the absorption coefficient exceeds 15 cm$^{-1}$, light extraction becomes challenging and the optical light output is limited due to the lack of optical transparency. Therefore, the absorption coefficient should preferably be lower than or equal to 15 cm$^{-1}$, more preferably lower than or equal to 13 cm$^{-1}$, and even more preferably lower than or equal to 9 cm$^{-1}$. Although it would obviously be desirable to achieve an absolute minimum value for the absorption coefficient, 0 cm$^{-1}$, considering practically achievable industrial production, a low limit for the absorption coefficient is 0.1 cm$^{-1}$, or even 0.2 cm$^{-1}$.

It is desirable that the highly transparent single crystalline AlN layers of this invention have a refractive index along the c-axis direction that is larger than along the a-axis, and that the difference between both refractive indices ranges from 0.05 to 0.15 at a wavelength of 265 nm. The inventors found that, if the refractive index along the c-axis direction is within this range, then the use of such AlN substrates for LED fabrication prevents low optical output and improves the device yield, i.e., reduces device failures. The reason for the observed correlation is not yet entirely clear, however, it is likely that moderately relaxed AlN is obtained if the refractive indices and their difference fall within the aforementioned range. As a result of the material's structural quality, it is thought that excellent device performance can be obtained. In order to further enhance this effect, the refractive index of the c-axis direction should be larger than that of the a-axis and the difference between both refractive indexes should preferably range from 0.08 to 0.12, and more preferably from 0.09 to 0.11.

The main surface area of highly transparent single crystalline AlN layers should preferably be larger than or equal to 100 mm$^2$ and the thickness should preferably range from 0.05 to 2.0 mm It is preferable that the density of defects originating from inclusions with maximum outer diameter from 1 to 200 pm be lower than or equal to 50 cm$^{-2}$ in the highly transparent single crystalline AlN layers.

It should be noted that the main surface of single crystalline AlN layers refers to a surface having the largest area in the single crystalline AlN layers. If the single crystalline AlN layers are used as substrates for the deposition of light emitting device layers, the main surface corresponds to the plane on which the light emitting device layers are formed. Accordingly, the main surface area refers to the area of the layer on which the light emitting device layers can be formed. The main surface area does not include the edge bevel where polycrystalline deposition may be inevitable. In addition, while the main surface area is preferably larger than or equal to 100 mm$^2$, there is no particular restriction to the upper limit value of the main surface area, as larger areas present industrial advantages. However, considering industrial production viability, in order to satisfy the requirements of the present invention, the practical upper limit of the main surface area is about 10,000 mm$^2$.

The inclusions with a largest outer diameter of 1 to 200 μm in single crystalline AlN layers can be observed using a bright field optical microscope operated in Nomarski differential interference mode, or using a confocal optical microscope, such as a laser microscope.

The density of the defects resulting from inclusions relevant to this invention is observed by Nomarski differential interference microscopy on the main surface of the single crystalline AlN layers. Typical optical magnification used for these observations ranges from 100× to 500×. The number of defects originating from inclusions with maximum outer diameter of 1 to 200 μm is counted. The density of these defects can then be quantified by dividing the number of counted defects by the area of the microscope's view field. These defects exist on the surface of single crystalline AlN layers, as well as in the layers. The inclusions on the surface and inside the layer can be observed by Nomarski differential interference microscopy for as long as the thickness of the layer is 0.05 to 2.0 mm.

If there are inclusions in single crystalline AlN layers, they cause secondary nucleation during growth. As a result of secondary nucleation, hexagonal growth features appear in the single crystalline AlN layers in localized areas, as shown in FIG. 1. The inclusions are observed as being buried inside the single crystalline AlN layers. It should be noted that, as shown in FIG. 2, even in absence of inclusions, hexagonal faceting can still occur depending on the crystal growth rate and the substrate off-cut angle. However, the presence of inclusions causing secondary nucleation, as described above, can be easily identified by optical microscopy.

In addition, the maximum outer diameter refers to the maximum length of the inclusions. The shape of the inclusions is generally indefinite; however, defects formed during growth at relatively high temperature may also appear as columnar shaped crystals. Inclusions with a maximum outer diameter smaller than 1 μm are not considered in this invention, since these inclusions are not known to cause any adverse effects.

Although the origin of these inclusions remains unclear at present, it is possible that they are the result of a gas-phase reaction between precursors and crystallized AlN deposited after these gases resided in the reactor. Consequently, for larger and thicker single crystalline AlN layers, the probability of deposition of inclusions on the AlN layers increases.

The area of AlN layers considered in the present invention is larger than or equal to 100 mm$^2$, and the layer thickness ranges from 0.05 to 2.0 mm, while the density of defects originating from inclusions with a size of 1 to 200 μm is less than or equal to 50 cm$^{-2}$. By keeping the density of mentioned defects below or equal to 50 cm$^{-2}$, the refractive index along the a-axis direction in the single crystalline AlN layers can easily be kept in the range from 2.250 to 2.400.

In this invention, when the density of the defects exceeds 50 cm$^{-2}$, the refractive index along the a-axis direction in single crystalline AlN layers is likely smaller than 2.250 and LEDs fabricated on such layers used as substrates is likely to cause device failure. From the viewpoint of improvement of device yield, the preferred density of aforementioned defects is lower than or equal to 35 cm$^{-2}$, and more preferably lower than or equal to 20 cm$^{-2}$. Generally, the lowest possible defect density is preferred. In other words, the lowest possible value would be 0 cm$^{-2}$, i.e., complete absence of defects and inclusions. Chemical analysis carried out by the inventors indicates that these inclusions were predominantly composed of Al, N and Cl.

Unlike voids, the inclusions have a significant impact during growth of the single crystalline AlN layers. It is possible to remove voids from the single crystalline AlN layers through an annealing process carried out even after the growth of AlN. By contrast, it is not easy to remove any inclusions once they have been embedded in the single crystalline AlN layers.

The presence of aforementioned defects decreases the refractive index in a-axis direction and the crystal quality of the single crystalline AlN layers. Finally, the performance of LEDs fabricated on the single crystalline AlN layers used as substrates is thought to be inferior.

Although the influence of inclusions on light emitting devices has not been fully understood to date, the inventors consider the following. First, as the density of defects in single crystalline AlN layers exceeds 50 $cm^{-2}$, the refractive index in a-axis direction becomes lower than 2.250 and the difference between the refractive indices in a-axis and c-axis directions decreases. If the inclusions act as a source of light scattering, then the transparency will likely be reduced.

If single crystalline AlN layers with a low refractive index and low transparency are used as substrates for LED fabrication, the probability of poor optical output or device failure increases. The mechanism of the effect of inclusion-related defects on LED performance may be explained as follows. Specifically, if the current flows through the light emitting device layers consisting of n-type layer, active layer, and p-type layer formed on the single crystalline AlN substrate with a large amount of inclusions, it appears that crystal defects exist vertically above the inclusions; it is likely that the locations of crystal defects right above the inclusions coincide with the locations of current leak paths in the light emitting device layers. It is believed that these crystal defects are qualitatively different from dislocations that propagate from the AlN single crystal layers (substrates) into the light emitting device layers. Even if the dislocation density in the light emitting device layers is low, it is assumed that the crystal defects formed above the locations of inclusions become the current leak paths and thus cause device failure. Therefore, the single crystalline AlN layers with a low density of inclusions disclosed in this invention can be efficiently used as substrates for light emitting devices.

The highly transparent single crystalline AlN layers of this invention preferably have high purity, such that the sum of Si, O, C, and B impurity concentrations is less than or equal to $1 \times 10^{19}$ $cm^{-3}$. It is possible to control the desired optical and electrical properties, such as optical transparency and electrical conductivity, by satisfying the aforementioned condition on impurity concentrations. When the sum of impurity concentration is lower than or equal to $1 \times 10^{19}$ $cm^{-3}$, the average lattice constant of highly transparent, single crystalline AlN layers is not influenced by the residual impurities. The sum of impurity concentrations is more preferably lower than or equal to $5 \times 10^{18}$ $cm^{-3}$, and most preferably lower than or equal to $3 \times 10^{17}$ $cm^{-3}$. The impurity concentrations can be determined by secondary ion mass spectrometry (SIMS).

As mentioned above, the order of inclusion formation is as follows. Minute particles originated from AlN are formed in the gas phase above the substrate. Some of the minute particles possibly arrive on the substrate surface by the gas flow. As a result, the minute particles arriving on the substrate are responsible for the observed inclusions. Growth conditions that enhance the growth rate of AlN single crystalline layers by supplying a relatively high concentration of AlN precursors are preferable in the HYPE method. As a result, gas phase reactions are the likely origin of the particles. Formation of substantial amounts of deposits in the reactor raises the probability of undesired deposits falling on the substrates. This phenomenon becomes more prominent for the growth of AlN single crystalline layers.

It is desirable that the highly transparent, single crystalline AlN layers of this invention have high crystal quality, since these layers are used as substrates for light emitting devices. Specifically, the full width at half maximum of x-ray rocking curves for the crystallographic (002) plane of these layers is preferably narrower than or equal to 1500 arcsec, more preferably between 1 arcsec and 500 arcsec and most preferably between 5 arcsec and 200 arcsec. If the single crystalline AlN layers have high crystallinity, the benefits of the present invention become more substantial. The measurement of the aforementioned x-ray rocking curves is performed using a four-bounce Ge monochromator.

The dislocation density of the highly transparent, single crystalline AlN layers described in this invention is preferably lower than or equal to $10^9$ $cm^{-2}$, more preferably lower than or equal to $10^7$ $cm^{-2}$, and most preferably lower than or equal to $10^5$ $cm^{-2}$. The use of such high-quality, single crystalline AlN layers as device substrates for the fabrication of light emitting devices leads to improved light output and a reduction in device failure. Methods to determine the dislocation density are well known. Samples with relatively high dislocation density can be observed by plan-view transmission electron microscopy (TEM). The dislocation density is calculated by dividing the total number of dislocations by the area of the view field. If the sample has a relatively low dislocation density, the mechanically polished surface is etched by a mixed solution of potassium hydroxide and sodium hydroxide (1:1 ratio by weight) at 300° C. for 5 to 10 min After etching, the etched surface is observed and the number of etch pits is counted by electron microscopy or optical microscopy. The dislocation density is then estimated by dividing the number of observed etched pits by the area of the view field.

When the highly transparent, single crystalline AlN layers of this invention are used as substrates for the fabrication of light emitting devices, the substrate surface should be prepared by grinding, followed by chemo-mechanical polishing to reduce residual surface roughness. Details of the polishing process are not particularly limiting to the present invention. It is also possible to utilize planarization processing by dry etching. In order to form the light emitting devices, the substrate before the growth should preferably have a very smooth and flat surface, consisting of atomic steps.

The highly transparent, single crystalline AlN layers of the present invention are preferably formed on the surface of a substrate fabricated from an AlN single crystal. In the following, stacks of single crystalline AlN layers deposited on AlN substrates will be considered.

II. Layer Stacks

The layer stacks considered in this invention comprise at least one highly transparent, single crystalline AlN layer deposited on at least a substrate surface consisting of a single crystalline AlN layer.

The substrates included in these layer stacks should not be particularly restricted as long as the substrate surface consists of a single crystalline AlN layer. These substrates may be produced by sublimation, solution, or HVPE methods. It is possible to use single crystalline AlN substrates produced by HVPE, as disclosed in WO2009/090923 and WO2009/090821, which are incorporated by reference herein. It is also possible to use single crystalline AlN substrates, such as those disclosed by Herro et al., Journal of Crystal Growth (Volume 312, Issue 18, 1 September 2010, Pages 2519-2521). Naturally, the crystallinity of the substrates affects the quality of the single crystalline AlN layers deposited thereon.

Therefore, in terms of the crystal quality of the substrates, the FWHM of x-ray rocking curves for the crystallographic (002) plane should be preferably narrower than or equal to 1500 arcsec, more preferably between 1~500 arcsec, and most preferably between 5~200 arcsec.

The dislocation density of the substrate can be preferably lower than or equal to $10^9$ cm$^{-2}$, more preferably lower than or equal to $10^7$ cm$^{-2}$, and most preferably lower than or equal to $10^5$ cm$^{-2}$. The use of such high-quality AlN substrates improves not only the crystallinity of the single crystalline AlN layers deposited thereon, but also enhances the benefits of this invention. Because the single crystalline AlN substrates are not limited by any transparency requirements, the substrates can be produced by the sublimation method. Frequently, single crystalline AlN substrates produced by the sublimation method exhibit absorption coefficients exceeding 100 cm$^{-1}$ at a wavelength of 265 nm.

The substrate diameter should be large enough to deposit single crystalline AlN layers of practical use and sufficiently thick to be freestanding. Specifically, the diameter should be larger than or equal to 5 mm, and up to 11 cm. The thickness should range from 0.1 mm to 1 mm, even though the acceptable thickness depends on the substrate diameter.

The substrate preferably has an average a-axis lattice constant of 0.31107 to 0.31113 nm The average value of this lattice constant is the average of five lattice constant measurements performed at the center of the substrate and at four additional positions. If the shape of the principal substrate surface is circular with a radius r, then the four additional measurement positions shall be equally distributed on a circle centered on the substrate surface center and of radius 0.5 r, i.e., the angle formed by a line connecting a certain measurement point to the center point and a line joining the neighboring measurement point to the center shall be 90°. If the shape of the principal substrate surface is square, the four additional positions are defined as the mid-points between the center and the corners of the square. A substrate will be deemed acceptable if its average lattice constant satisfies the aforementioned range. In this case, the generation of cracks in single crystalline AlN layers deposited on the substrate is efficiently suppressed. The average value of the lattice constant is the value measured by the method mentioned in the example below. Additionally, a substrate suitable for growth preferably has a flat surface featuring atomic steps.

The lattice constant at each measurement point is obtained by using Equations 2 and 3 below after measuring the spacing of (006) planes, $d_{006}$, and the spacing of (105) planes, $d_{105}$, for single crystalline AlN.

$$c = 6 \times d_{006} \quad \text{(Equation 2)}$$

$$a = 2cd_{105}/(3c^2 - 75d_{105}^2)^{0.5} \quad \text{(Equation 3)}$$

As the (006) and (105) reflections in single crystalline AlN correspond to large 2-theta angles in the x-ray diffraction measurement, the spacing of these planes can be measured particularly accurately.

The X-ray diffraction measurement is preferably carried out in the following way. A Spectris Co., Ltd. X'Pert ProMRD is used as the X-ray diffraction instrument. The x-ray beam is generated by operating a Cu anode x-ray tube at an acceleration voltage of 45 kV and a filament current of 40 mA. The x-ray beam is filtered through a slit with ½ degree divergence, an x-ray mirror, a Ge (220) four bounce monochromator, and a cross slit of 4 mm width, and then irradiates each of the sample positions defined above. The x-rays diffracted from the AlN single crystal are detected using a Xe proportional counter tube after being passed through an analyzer crystal. Furthermore, the 0 position of the 2-theta angle for the detector is preferably calibrated before the measurement by adjusting the optics in order to guarantee a reproducible measurement of the lattice constant.

The layer stacks considered here preferably satisfy the following equation:

$$|a_1 - a_2|/a_1 \leq 90 \text{ ppm}, \quad \text{(Equation 4)}$$

where the average lattice constants of the substrate and of the highly transparent single crystalline AlN layer deposited on the substrate are represented by $a_1$ and $a_2$, respectively, with $a_2$ being the average value of five measurements. The measurement positions used to determine $a_2$ coincide with the measurement positions used to determine $a_1$. Furthermore, for the measurement of the average value of the lattice constant, $a_2$, the AlN single crystalline layer either has an as-grown surface or a flat surface featuring atomic steps. As the penetration depth of x-rays is more than 1 μm for the measurement conditions used in this invention, the measurement is not influenced by surface roughness resulting from polishing. As a consequence, the lattice constant for the AlN single crystalline layers can be measured without influence from the surface roughness.

Satisfying the condition described by Equation 4 for the layer stack implies not only a small number of inclusions in the crystalline layers, but also a small number of other features that would adversely affect crystal growth, such as polishing scratches, surface oxides, or pits. As a result, these highly transparent, single crystalline AlN layers are suitable as substrates for light emitting devices. As the precursors of AlN have high reactivity in the gas phase, HVPE growth of AlN is particularly challenging. The presence of any inclusions adversely affects the relation between $a_1$ and $a_2$, and furthermore, any other factors that adversely affect crystal growth need to be reduced in order to obtain high-quality, single crystalline AlN layers that satisfy the relation between $a_1$ and $a_2$. In particular, when AlN single crystalline substrates are used that feature (002) x-ray rocking curves ranging from 1 to 1500 arcsec FWHM and a dislocation density lower than or equal to $1 \times 10^9$ cm$^{-2}$, and when the relation shown in Equation 4 is satisfied, then AlN single crystalline layers can easily be produced such that their refractive index in a-axis direction ranges from 2.250 to 2.400 and such that the absorption coefficient is lower than or equal to 15 cm$^{-2}$ at a wavelength of 265 nm.

In order to form highly transparent AlN single crystalline layers with high crystallinity intended for use as substrates for light emitting devices, $|a_1-a_2|/a_1 \leq 90$ ppm is preferable, $|a_1-a_2|/a_1 \leq 80$ ppm is more preferable, and $|a_1-a_2|/a_1 \leq 60$ ppm is most preferable. Furthermore, as there are no particular limitations to the minimum value of $|a_1-a_2|/a_1$, in principle a value of 0 (i.e., $a_1$ and $a_2$ being identical) would be preferable. However, a low limit could be 5 ppm in terms of feasibility in industrial production.

The method of deposition of highly transparent AlN single crystalline layers on a substrate is not particularly restricted. MOCVD and HVPE methods can both be used. The HVPE method is preferably used since the incorporation of impurities can be prevented relatively easily. As a result, HVPE grown AlN single crystalline layers are likely to show good optical properties such as optical transparency and light emitting characteristics. The HVPE method can prevent impurity incorporation from the reactor due to the lower growth process temperatures as compared to the sublimation method. As a result, the HVPE method can produce single crystalline AlN layers of higher transparency. In addition, when electrical conductivity needs to be controlled, desired dopant concentrations can easily be achieved by supplying the dopants along with the nitride precursors. Furthermore, as the metal chloride used in the HVPE method can be supplied to the reactor at a relatively high concentration, enhanced growth rates of single crystalline AlN layers can be achieved. The production method for these layer stacks will be explained in the following.

III. Production Method for Layer Stacks

When producing the layer stacks of the present invention, the highly transparent AlN single crystalline layers are preferably formed using the HVPE method. In this method, it is preferable that the growth surface of the substrate be flat with atomic steps prior to growth. A flat surface featuring atomic steps typically has a root mean square roughness less than or equal to 1.0 nm, and more favorably, less than or equal to 0.5 nm. In order for the surface to have atomic steps prior to growth, the substrate surface is prepared using chemo-mechanical polishing (CMP). In addition, to achieve best surface flatness, the substrate surface can be prepared by dry-etching, and a combination of CMP and dry etching is also possible.

For the layer stacks of this invention, the crystallinity of the overgrown single crystalline AlN layers is determined by the crystallinity of the substrates. The crystallinity of the deposited single crystalline AlN layers is likely to improve by increasing the layer thickness. However, for thin single crystalline AlN layers, their crystallinity directly depends on that of the substrates.

Japanese Pat. Appl. Pub. No. 2006-16294 shows the formation method of HYPE-grown AlN single crystalline layers on highly crystalline substrates produced by the sublimation method. When the inventors followed the method disclosed in this document, deposited single crystalline AlN layers, and used these layers as substrates for light emitting device fabrication, the resulting light emitting devices sometimes showed device failure. After investigating the cause, the refractive index in a-axis direction for the single crystalline AlN layers was found to be below 2.250. This trend was frequently observed in cases where the difference between the refractive indices in a-axis and c-axis directions was less than 0.05 and inclusions were included in the AlN single crystalline layers. After further investigating the origin of the undesired inclusion formation, the growth condition described in the patent document was found to produce large amounts of undesired deposits in the reactor, since gas phase pre-reactions above the substrate were likely to happen under these growth conditions.

By adopting a production method that reduces the undesired formation of deposits in the reactor, highly transparent AlN single crystalline layers can be produced with a refractive index in a-axis direction ranging from 2.250 to 2.400 and with an absorption coefficient lower than or equal to 15 $cm^{-1}$. Under these circumstances, AlN single crystalline layers can be reproducibly grown with a larger refractive index in the c-axis direction than in a-axis direction, and with the difference between refractive indices in a-axis and c-axis directions ranging from 0.05 to 0.15. It was found that the density of undesired inclusions could be reduced by decreasing reactor wall deposits. The light emitting devices fabricated on highly transparent, single crystalline AlN layers produced by the aforementioned method showed improved device yield. In particular, the use of thick AlN single crystalline layers with low density of inclusions and comparatively large principal surface area significantly improved device yield. In addition, in order to produce single crystalline AlN layers of higher quality, it is preferable to form layers satisfying the relation of $|a_1-a_2|/a_1 \leq 90$ ppm for the average lattice constants for the substrates, $a_1$, and for the overgrown layer, $a_2$, respectively.

As mentioned above, the highly transparent, single crystalline AlN layers of this invention are preferably produced using the HYPE growth method. As is generally known, HYPE is one type of chemical vapor deposition method employed to grow metal-nitrides by supplying aluminum chloride gas and nitrogen precursors to react on heated substrates. In general, aluminum chloride is used as the metal chloride gas. Ammonia gas is chosen as the nitrogen precursor. Aluminum chloride gas is preferably produced as the product of reacting Al with hydrogen chloride or chlorine gas. Alternatively, aluminum chloride gas can be formed as solid aluminum chloride is vaporized.

According to the analysis of the inventors, the constituents of the reactor deposits are surmised to be aluminum nitride, aluminum chloride, the adducts formed by aluminum chloride and ammonia, aluminum, and ammonium chloride. From this result, in order to grow AlN, when aluminum chloride gas and ammonia are used, adduct species of aluminum nitride, aluminum, aluminum chloride, and ammonia are produced as gas-phase reactions in the gas flow and ammonium chloride is produced as a by-product. Furthermore, non-reacted aluminum chloride condenses on the walls of the flow channel, and as a result, deposits are formed. Particles that separated from these deposits are transported by the gas flow in the flow channels, and may be deposited on the substrate. As a consequence, it was found that inclusions were formed as the particles were deposited on the surface of the AlN single crystalline layers during growth.

The amount of deposited material on the wall of the flow channel increased as a function of growth time. As a result, particles are likely deposited on AlN single crystalline layers. Furthermore, in order to obtain relatively high growth rates more than or equal to 10 μm/hr by HVPE for AlN growth, the supply rates of aluminum chloride gas and nitrogen precursor gas into the HVPE reactor need to be increased. As a result, the amount of wall deposits likely increases as well. Therefore, in order to form relatively thick, single crystalline AlN layers on the substrates, with deposition thicknesses of more than or equal to 0.05 mm, it is necessary to pay attention to deposit formation on the wall surfaces of the flow channel.

FIG. 3 shows an example of an HYPE system for the growth of AlN single crystalline layers. Although FIG. 3 is an example of a horizontal HVPE system with horizontal gas flow, this figure can be equally applied to a horizontal system with vertical gas flow (i.e., the direction of gas flow is not level at the substrate surface), a vertical system with horizontal gas flow, and a vertical system with vertical gas flow.

First, the substrate (31) is loaded onto the susceptor (33) in the flow channel (32). The flow channel is defined as the flow path for the precursor gases supplied into the HVPE reactor. In general, quartz glass is used to form the flow channel (32). The susceptor (33) is used as a holder for the substrate (31). In general, the susceptor is made of materials such as graphite, pBN coated graphite, TaC coated graphite, SiC-coated graphite, quartz glass, alumina, SiC, W, or TaC.

The substrate (31) and the susceptor (33) are heated to a predetermined temperature by using a local heating arrangement (34), or an external heating arrangement (35) installed outside of the flow channel (32). Although local heating is not a required instrument configuration, in particular, local heating is very useful for growth temperatures higher than or equal to 1200° C., which is the operating temperature limit for the quartz glass used as the flow channel. Although FIG. 3 illustrates the local heating arrangement at the example of RF inductive heating, a radiative heating method can also be used. External heating can be used for substrate heating below the operating temperature limit of the quartz glass. It can also be used to control the gas temperature in combination with local heating. The external heating arrangement can cover the entire circumference of the flow channel or only part of the circumference. Typically, external heating is implemented as a resistive heating method. In order to precisely control the temperature distribution inside the flow channel, the external heating arrangement is divided into a plurality of heating zones.

The supply nozzle for aluminum chloride (36) and the supply nozzle for the nitrogen precursor gas (37) are installed at the upstream side of the flow channel (32). Aluminum chloride gas and the nitrogen precursor gas generated by the method described above are supplied from nozzles (36, 37) and AlN single crystalline layers are formed on the heated substrates. Even though FIG. 3 does not include a shield gas nozzle, it is preferable to implement a shield gas nozzle surrounding the outer circumference of the aluminum chloride supply nozzle. The purpose of the shield gas is to control the mixing of aluminum chloride gas and ammonia gas. Nitrogen or argon gas is used as a shield gas. Aluminum chloride gas or the nitrogen precursor gas is diluted appropriately in hydrogen gas or inert gases such as nitrogen or argon. These gases are supplied to form AlN single crystalline layers. Carrier gas is used to promote gas flow in the flow channel toward the exhaust port (38), and is supplied at the outer circumference of the aluminum chloride supply nozzle (36) and the nitrogen precursor gas supply nozzle (37). Hydrogen gas and/or inert gases such as nitrogen and argon gases are preferably used as carrier gas.

Furthermore, the chamber (39) encapsulates the outer circumference of the flow channel (32). The chamber (39) is preferably made of stainless steel with a water-cooling jacket. In case of flow channel damage, the use of a stainless steel chamber provides a safety containment.

Prior to the growth of AlN single crystalline layers, and in order to remove contaminants, the substrate (31) is cleaned by the following procedure. The substrate is treated by ultrasonic cleaning using organic solvents, and then etched in an acid solution. Following the cleaning procedure, the substrate (31) is loaded on the susceptor (33) and then heated to the growth temperature of the AlN single crystalline layer while flowing carrier gas. The range of growth temperature is preferably 900 to 1700° C., more preferably 1200 to 1650° C., even more preferably 1400 to 1600° C., and most preferably 1450 to 1600° C. In order to heat the substrate in the ranges mentioned above, a combination of local heating (34) and external heating (35) is used, or either one method of heating may also be used individually. AlN single crystalline layers of high quality cannot be obtained at low growth temperatures. At the high end of the temperature range, decomposition of the AlN single crystal is likely to occur.

AlN single crystalline layers are grown on substrates (31) by supplying aluminum chloride gas and the nitrogen precursor gas. In this case, the partial pressure of the supplied aluminum chloride gas is kept in the range of 0.00001 to 0.1 atm, more preferably in the range of 0.00005 to 0.05 atm, even more preferably in the range of 0.0001 to 0.01 atm. In addition, the partial pressure of the supplied nitrogen precursor gas is kept in the range of 0.00004 to 0.2 atm, more preferably in the range of 0.0001 to 0.1 atm, even more preferably in the range of 0.0002 to 0.05 atm. The ratio of the nitrogen precursor to that of aluminum chloride is preferably within a range of 0.5 to 100, more preferably 0.6 to 20, and most preferably 1 to 8. The suitable pressure range in the flow channel system is 0.01 to 1.3 atm. The supply of aluminum chloride gas is stopped when the desired film thickness of the single crystalline AlN layer has been achieved. In this case, in order to prevent thermal decomposition of the deposited single crystalline AlN layer, nitrogen precursor gas is preferably supplied until the decomposition of the AlN layer no longer occurs, for example, until the temperature is lower than about 500° C.

Although, in the present invention, AlN single crystalline layers can basically be grown by the method described above, it is particularly preferable to grow the AlN single crystalline layers by satisfying the following conditions. More specifically, when the AlN single crystalline layers are grown by the HVPE method, AlN single crystalline layers are preferably formed under the following conditions. First, the tip of the aluminum chloride gas supply nozzle is located such that the gas flow extends 200 mm both upstream and downstream of the gas nozzle. Secondly, on those parts of the wall surface of the flow channel which are at a temperature of less than or equal to 1200° C., the amount of aluminum contained in deposits formed on the wall surface is less than or equal to 30% of the amount of aluminum introduced into the reactor. It should be noted that the wall of the flow channel mentioned here refers to the combined area of the wall surface inside the flow channel through which carrier gas circulates, and the outer wall surfaces of the aluminum chloride gas supply nozzle and the nitrogen precursor gas supply nozzle. Thus, the amount of deposits on the wall surface of the flow channel includes the amount of deposits on the aluminum chloride gas supply nozzle (36) and the nitrogen precursor gas supply nozzle (37) in the range of aforementioned 200 mm distance up- and downstream from the nozzle tip.

The amount of metal elements contained in the deposits on the wall of the flow channel is determined in the following steps. The inner wall of the flow channel in the range of 200 mm in the upstream and downstream directions from the tip of aluminum chloride nozzle, and where surface temperatures remained below or equal to 1200° C., is removed. The gas supply nozzles for metal chlorides and for nitrogen precursor gas are also removed. The deposits formed at the locations previously mentioned are immersed into alkaline aqueous solution and the deposits are dissolved. The amount of aluminum contained in the solution is determined by inductively coupled plasma emission spectrometry.

More specifically, the wall surface of the flow channel is immersed for one hour in an aqueous solution of 1% tetramethylammonium hydroxide (TMAH) with a volume of V liters. The 1% TMAH aqueous solution preferably has a low content of metal impurities. For example, 1% TMAH solution can be made from Tokuso SD-1 (manufactured by Tokuyama Corporation, 2.38% TMAH) diluted with ultrapure water having a resistivity of 18.2 Mohm-cm or higher.

After the dip the solution is appropriately diluted with ultrapure water to a concentration suitable for quantitative analysis performed by inductively coupled plasma-optical emission analysis. Then, the aluminum concentration in the solution is quantified by inductively coupled plasma atomic emission spectrometry. Assuming that the measured concentration of aluminum is C (ppm=mg/L), and that the collected solution had been diluted A times, then the amount of the metal element $B_{depo}$ (mol) deposited on the inner wall of the flow channel is calculated as $VAC/1000/M_{Al}$ (mol), where $M_{Al}$ is the atomic weight of elemental aluminum.

The amount of metal element $B_{input}$ (mol) supplied to the HVPE apparatus can be estimated as well. For example, when the metal chloride gas is obtained from a reaction of aluminum metal and hydrogen chloride, the metal element $B_{input}$ (mol) can be estimated from the total volume $V_{HCl}$ (ml) of hydrogen chloride supplied during the growth of the AlN single crystalline layers. For example, when hydrogen chloride and aluminum metal are reacted at 700° C. or less to form aluminum trichloride, $B_{input}$ (mol) is calculated by the following equation: $B_{input}$ (mol)=$V_{HCl}/(3\times22400)$ (mol). In addition, when hydrogen chloride and aluminum metal are reacted at higher than 700° C. to form aluminum chloride as the main component, $B_{input}$(mol) is calculated by the following equation: $B_{input}$(mop=$V_{HCl}/22400$ (mol).

As mentioned above, the amount of the metal element $B_{depo}$ (mol) deposited on the inner wall of the flow channel is calculated as $VAC/1000/M_{Al}$ (mol). According to the study of the inventors, if the ratio of $B_{depo}/B_{input}$ calculated from the estimated amounts of metal element $B_{depo}$ (mol) deposited on the walls and the amount of metal element $B_{input}$ (mol) supplied to the HVPE apparatus is preferably less than or equal to 30%, more preferably less than or equal to 20%, and most preferably less than or equal to 10%, then the density of undesired inclusions in the AlN single crystalline layers can be reduced.

In addition, in the case of using solid aluminum chloride as the precursor, the amount of metal element supplied to the HVPE apparatus is calculated based on the product of the vapor pressure of aluminum chloride and the total carrier gas flow rate. In addition, the amount deposited on the wall surface of the flow channel is calculated in the same manner as mentioned above.

In general, it is understood that the amount of the deposits downstream of the tip of the gas supply nozzle, and especially around the substrate, should be kept as low as possible. However, according to the study of the inventors, in order to produce AlN single crystalline layers of the high quality required for use as substrates for the fabrication of light emitting devices, it was found that the amount of material deposited upstream of the nozzle location should be reduced. This observation may be explained as follows. Since the deposits downstream of the nozzle are formed at relatively higher temperatures in comparison to the deposits formed near the tip of the gas supply nozzle, the downstream deposits strongly adhere to the wall surface. As a result, it is unlikely that the downstream deposits would influence the growth of AlN single crystalline layers. On the other hand, since the upstream deposits are formed at a relatively low temperature, they adhere only weakly to the wall, can be easily removed from the wall, and particles originating from the deposits may be transported onto the AlN single crystalline layer during the growth.

Japanese Pat. Appl. Pub. No. 2005-343705 teaches the growth of an AlN single crystalline layer at a wall surface temperature of 400 to 1100° C., controlled by external heating, and at a substrate temperature of 1100 to 1400° C. controlled by local heating inside the reactor. In Japanese Pat. Appl. Pub. No. 2008-19130, the inventors propose that the crystal quality of AlN single crystalline layers is improved by keeping the temperature of the wall surface 150° C. lower than the substrate temperature. However, when thick AlN single crystalline layers with a larger area are grown at a high growth rate exceeding 10 μm/h, deposits on the wall of the growth reactor cause the problem of particle contamination onto the substrate and incorporation into the AlN single crystalline layers as growth progresses with time.

On the other hand, because the growth temperature and the wall temperatures are around 1100° C., and because of the very high ratio of the nitrogen precursor gas to aluminum chloride gas of about 100, the amount of deposits on the wall is increased through a more active gas phase reaction between aluminum chloride and the nitrogen precursor, and as a result, high quality AlN single crystalline layers cannot be formed.

Because the deposits strongly adhere to the wall surface when the wall surface temperature is 1200° C. or higher, they no longer act as a source of particles that would affect the growth surface of the AlN single crystalline layers. On the other hand, if the temperature is kept below 1200° C., the deposits only weakly adhere to the wall as the temperature is lowered. As a result, the deposits detach from the wall surface and then some of the detached particles are deposited on the surface of the AlN single crystalline layers during growth. This phenomenon becomes significant with decreasing temperature of the wall surface of the flow channel Accordingly, it is important to reduce the amount of material deposited on the wall surface of the flow channel kept at ≤1200° C. within 200 mm upstream and downstream of the tip of the aluminum chloride supply nozzle. Reduction of the deposited material leads to a reduction of the number of inclusions, and thus, AlN single crystalline layers can be easily produced.

In order to limit the amount of deposits formed on the inner wall surface of the flow channel within 200 mm upstream and downstream of the tip of the aluminum chloride nozzle (36), the supply rates of precursors, the supply ratio, the supply method, the growth temperature, the external heating arrangement and the local heating arrangement, and the pressure have to be optimized depending on the size and geometry of the growth reactor (e.g., the shape of the flow channel, the aluminum chloride nozzle, and the ammonia nozzle). For example, in order to efficiently use the precursors for crystal growth on the substrate, the desired reduction of deposits can be achieved by controlling the shield gas, the supply rate of aluminum chloride gas, and the supply rate of the nitrogen precursor. In order to prevent gas from stagnating in the flow channel, the gas should be efficiently pumped out after the reaction. For this purpose the area of the exhaust port with respect to the cross-sectional area of the flow channel should be 30 to 200%, more preferably 50 to 150%, and even more preferably 60 to 100%. In addition, in order to pump more efficiently, it is advantageous to reduce the pressure in the flow channel. The suitable range of pressure in the flow channel is preferably 0.01 to 1.3 atm, more preferably 0.1 to 1 atm, and even more preferably 0.2 to 0.99 atm.

In addition, by implementing a baffle plate (40) upstream of the aluminum chloride gas supply nozzle (36), the amount of deposits on the wall surface can be reduced. The baffle plate serves to shape and direct the carrier gas flow in the downstream direction. The baffle plate includes a plurality of holes, through which the carrier gas flows. The baffle plate may be made of quartz glass, alumina, or BN, and similar materials used for the flow channel. As long as the baffle plate is installed upstream of the gas supply nozzle for aluminum chloride (36), the installation position of the nozzle is not critical. However, the installation position of the baffle plate is preferably 0 to 500 mm, more preferably 10 to 300 mm, even more preferably 50 to 200 mm upstream of the tip of the nozzle. The baffle plate suppresses the reverse flow of gas in the upstream direction due to convection inside the flow channel. The effect of the baffle plate is very significant since it renders the use of excessively low pressures and flowing of large amounts of carrier gas unnecessary.

The layer stacks of the present invention can be produced by depositing highly transparent AlN single crystalline layers onto substrates by methods such as those described above. After separating the AlN single crystalline layers from the substrate, these layers can be used as substrates for the fabrication of light emitting devices (see FIG. 6). Alternatively, the light emitting device structures can be formed on the AlN single crystalline layer stacks, and the original substrate can be removed subsequently (see FIG. 5). Next, the production method for light-emitting devices on highly transparent AlN single crystalline layers will be explained.

IV. Structure And Formation Method of the Light Emitting Device

Next, a general method to form light emitting devices is explained. A production method for light emitting devices (LEDs) using the aforementioned layer stacks is explained in FIG. 5. First, the layer stack comprised of a highly transparent AlN single crystalline layer (12) deposited on the substrate (11) is prepared according to the method described above. The light emitting device layers (13) are then deposited on this layer stack. Furthermore, a p-type electrode (14) and an n-type electrode (15) are formed in different steps of the deposition process. For the fabrication of the light emitting device layers (13), the layer structure including n-type, active, and p-type layers can be grown by well-known epitaxy methods, including MOCVD, HVPE and MBE methods. Among these methods, the MOCVD process is preferable in order to control the thickness of the device layers as well as the incorporation of dopants.

At first, after loading the layer stack into a MOCVD reactor, the aforementioned layer stack is heated above 1050° C., and more preferably above 1150° C. After cleaning the surface of the highly transparent AlN single crystalline layer (12) through annealing in a hydrogen atmosphere, an n-type nitride semiconductor layer is formed by introducing trimethylaluminum, trimethylgallium, ammonia, silane or tetraethylsilane and hydrogen gas, as well as nitrogen as a carrier gas for precursors.

Prior to the formation of the n-type nitride semiconductor layer, a buffer layer can also be deposited with the purpose to improve the n-type characteristics. In this case, the buffer layer is preferably an n-type nitride semiconductor and has a lattice constant that is either identical to or intermediate to the lattice constant of the n-type nitride semiconductor and the highly transparent single crystalline AlN layer. In addition, the buffer layer can either be a single layer or a multiple layer stack with different compositions.

Next, the quantum well structure that becomes a light emitting layer is formed by introducing into the MOCVD apparatus trimethylaluminum, trimethylgallium, ammonia, silane or tetraethylsilane and hydrogen gas, as well as nitrogen as a carrier gas for the precursors. The quantum well structure is a stack structure that combines well layers with thicknesses of several nm to several tens of nm, and barrier layers with larger band gap energy than the well layers. The band gap energy and thickness of the well layers and the barrier layers can be appropriately tailored to obtain the desired optical emission properties. In addition to precursors, in order to improve the optical properties, trimethylindium, as well as n-type and p-type dopants can be added.

Next, a p-type nitride semiconductor layer is formed by introducing into the MOCVD apparatus trimethylaluminum, trimethylgallium, ammonia, bis-cyclopentadienyl magnesium and hydrogen gas, as well as nitrogen as a carrier gas for the precursors. Then, a p-type nitride semiconductor contact layer is formed by introducing trimethyl gallium, ammonia, biscyclopentadienyl magnesium, and hydrogen gas, as well as nitrogen as a carrier gas for the precursors. When the group III-nitride semiconductor layers mentioned above are formed, the precursor supply ratio, the growth temperature, and the ratio of nitrogen to III-metals (V/III ratio) can be appropriately tailored in order to obtain the desired optical and electrical properties.

In order to produce a functional light emitting device, which is produced by the above-mentioned process, it is necessary to carry out device fabrication processes, such as etching to expose a given conductive layer, and electrode formation steps to contact the conductive layer surface.

Although the substrate (11) removal process from the layer stack can be achieved by known methods including polishing, reactive ion etching, or wet etching using an alkaline solution, the polishing method is preferred.

In addition, after the removal of the substrate, roughness can be intentionally formed on the removed surface side of the AlN single crystalline layer (12). When the roughness formation process is applied, the presence of roughness reduces the amount of total reflection on the backside of the substrate, and as a result, the emission characteristics of the light emitting device can potentially be improved.

FIG. 6 describes an alternative process flow for the production of a light emitting device. In this case, the substrate is removed in advance from the layer stack (11), and the highly transparent AlN single crystalline layer (12) is then used as a substrate for the light emitting device fabrication. The method to remove the substrate from the layer stack is well known and identical to the aforementioned methods. The production method for the LEDs by using the highly transparent AlN single crystalline layer (12) as the device substrate is the same as the production method using the layer stack as the substrate. Light emitting devices are then obtained through device processing and chip fabrication as required for a variety of applications.

V. Examples

Although concrete practical, as well as comparative, examples of the invention are explained herein, this invention is not limited to those practical examples. Data from the Practical Examples and the Comparative Examples are summarized in FIGS. 8 and 9, respectively.

PRACTICAL EXAMPLE 1

Preparation of the Substrate

This is a practical example that utilizes a composite substrate consisting of an AlN polycrystalline layer and an AlN single crystalline layer. The composite substrate was prepared according to the method described in Japanese Pat. No 4565042. After loading a BN mask with a diameter of 26 mm onto a (111) Si substrate with a diameter of 50.4 mm, a 0.3 μm thick single crystalline AlN thin film was deposited on the single crystalline Si substrate. Then, after deposition of a 230 μm thick AlN polycrystal, the composite layers were removed from the Si substrate by cooling it to room temperature. The substrate with a diameter of 26 mm was obtained by dissolving and removing residual Si sticking to the single crystalline AlN thin film using a mixture of hydrofluoric acid, nitric acid, and acetic acid at room temperature.

Analysis of the Substrate

As for the composite substrate, the AlN single crystalline thin film side was used in the following as the growth surface for the highly transparent AlN single crystalline layers of the present invention. Lattice constants were measured at a total of five locations in the AlN single crystalline thin film The five locations consisted of the center and additional four points located on a radius of 7 mm from the center. The latter four points were separated by an angle of 90° from each other. The average value of the lattice constant from the total five measurements of the lattice constants was 0.311099 nm In addition, x-ray rocking curves of the (002) plane had a full width at half maximum of 3800 arcsec, and the absorption coefficient was 1800 $cm^{-1}$.

Production of the Layer Stack (i.e., Growth of an AlN Single Crystalline Layer)

After conducting an ultrasonic clean using acetone and isopropyl alcohol of the composite substrate, it was mounted on a BN coated graphite susceptor (33) in the HVPE apparatus shown in FIG. 3. In this case, the side with the AlN single crystal thin film of the composite substrate was used as the surface for AlN single crystal growth. The baffle plate was positioned at 250 mm from the tip of the metal chloride supply nozzle (36) in the upstream direction. The baffle plate was welded to the inner wall of the flow channel. Carrier gas was flown through 24 through-holes with a diameter of 3 mm each in the baffle plate (as shown in FIG. 4). For the carrier gas, a mixture of hydrogen and nitrogen with a ratio of 7 to 3 was used. The substrate was heated to 1450° C. while supplying ammonia gas through a quartz glass gas supply nozzle for the nitrogen precursor (37). After heating it to 1450° C., aluminum chloride gas was supplied through a quartz glass gas supply nozzle for aluminum chloride (36) to grow the AlN single crystalline layer for 10 hr.

FIG. 3 does not include a quartz glass boat, however, the actual HVPE apparatus includes aluminum metal placed in a quartz glass boat located in the upstream direction of the supply nozzle for aluminum chloride (36). Aluminum trichloride gas was generated by flowing carrier gas with 10.8 sccm hydrogen chloride gas over the aluminum metal heated to 400° C.

The supply nozzle for the metal chloride (36) provided a total flow rate of carrier gas and aluminum chloride gas of 1800 sccm. The supply nozzle for the nitrogen precursor (36) provided a total flow rate of carrier gas and ammonia gas of 200 sccm. The flow rate of the carrier gas (flown through the baffle plate) was 6500 sccm. Although not shown in FIG. 3, a shield gas nozzle was installed concentrically around the outer circumference of the supply nozzle for metal chloride. This shield gas nozzle supplied a nitrogen gas flow rate of 1500 sccm. Therefore, the total flow rate of all carrier gases was 10,000 sccm. During the growth, the partial pressures of aluminum trichloride and ammonia were 0.00036 atm and 0.0026 atm, respectively. The reactor total pressure was kept at 0.99 atm.

When the temperature at the quartz glass flow channel was measured by contacting it with a thermocouple during a test experiment, i.e., not during growth, the temperature was below 1200° C. at a position 15 mm away from the outer circumference of the 50 mm diameter susceptor. The flow channel right above the susceptor was at 1000° C. The temperature at the tip of the nozzle was 700° C., and the nozzle temperature monotonically decreased to 402° C. over a 200 mm distance upstream from the nozzle tip.

After the growth of the AlN single crystalline layers, ammonia gas was supplied until the temperature was reduced to 500° C., and thereafter the reactor was cooled to room temperature.

Analysis of the Layer Stack (Single Crystal Aluminum Nitride Layer)

In the resulting layer stack, no cracking was observed in the AlN single crystalline layer. The thickness was 300 μm, as measured by cross-sectional scanning electron microscopy. On the grown AlN single crystalline layer, five measurement locations consisted of the center of the sample, and four additional points located at a radius of 7 mm from the center. Then latter four points were separated by an angle of 90° from each other. The average value of the lattice constant calculated from the total of five measurements taken at the aforementioned locations was 0.311107 nm, and $|a_1-a_2|/a_1$ was 26 ppm.

In addition, the density of defects resulting from inclusions was 10 $cm^{-2}$, as established by observing the inclusions by Nomarski differential interference microscopy. X-ray rocking curves of the (002) plane had a FWHM of 1200 arcsec. Dislocations present in the AlN single crystalline layers were observed by plan view transmission electron microscopy. A dislocation density of $8 \times 10^8$ $cm^{-2}$ was calculated by dividing the number of dislocations by the area of the view field. In addition, impurity concentrations measured by secondary ion mass spectroscopy (SIMS) were $5 \times 10^{16}$ $cm^{-3}$ for Si, $4 \times 10^{16}$ $cm^{-3}$ for O below the detection limit for C, and $1 \times 10^{15}$ $cm^{-3}$ for B. Therefore, the total impurity concentration was $9.1 \times 10^{16}$ $cm^{-3}$.

A freestanding, 150 μm thick AlN single crystalline layer was prepared for spectroscopic ellipsometry by the following process: obtaining a 3 mm square layer stack cut out from part of the entire layer stack, grinding to remove the substrate of the layer stack, and finishing the substrate surface side of the layer stack and the substrate surface side by mechanical polishing to a mirror finish. At the final step of the polishing process, a lapping plate made of tin was used with 0.1 μm diameter alumina slurry. When the refractive index was measured and analyzed by the spectroscopic ellipsometer, the refractive indices of the a-axis and c-axis directions were 2.325 and 2.383, respectively, and the difference between these refractive indices was 0.058 at a wavelength of 250 nm. The anisotropy of the a-axis direction and the c-axis direction was not observed in the extinction coefficient, and the extinction coefficient was 0.000026. The absorption coefficient was calculated from Equation 1 with the extinction coefficient at a wavelength of 250 nm, and it was 13 $cm^{-1}$.

In addition, at a wavelength of 265 nm, the refractive index of the a-axis direction was 2.276, the refractive index of the c-axis direction was 2.330, and the corresponding refractive index difference was 0.054. On the other hand, the anisotropy of the a-axis direction and the c-axis direction was not observed, and the extinction coefficient was 0.000025. The absorption coefficient was calculated from Equation 1 with the extinction coefficient at a wavelength of 265 nm, and it was 12 $cm^{-1}$. No significant absorption was observed in the ultraviolet region from 300 nm to the band edge.

Measurement of Deposits on the Wall Surface of the Flow Channel

After growth, in the range of 200 mm upstream to 200 mm downstream from the nozzle tip, quantitative analysis of wall deposits in the flow channel was carried out. After removing the components of the flow channel from the HVPE apparatus, the parts in the above-mentioned range and that were kept below 1200° C. were immersed in 3 liters of an aqueous solution of 1% TMAH for 1 hour. In this case, the container that was used was made of fluorine resin (PFA) and washed with ultrapure water before use. After diluting the obtained wash solution 50 times, the amount of Al was measured by inductively coupled plasma-optical emission spectrometry, and a concentration of 3.5 ppm was found. Therefore, the Al element content in the deposits on the inner wall of the flow channel, $B_{depo}$, was calculated to be 0.0195 mol.

On the other hand, the amount of metal elements supplied to the HYPE equipment, $B_{input}$ was estimated to be 0.1071 mol, because 10.8 sccm hydrogen chloride was supplied for 10 hours, i.e., the total supply of hydrogen chloride was 6480 ml. Therefore, $B_{depo}/B_{input}$ was 20%.

Production and Characterization of LEDs

The surface of the AlN single crystalline layer from the layer stack of this practical example was finished by mechanically polishing to a mirror finish and by chemomechanical polishing. As a result, atomic steps were observed on the polished surface. The AlN single crystalline layer was loaded into an MOCVD apparatus. Subsequently, the surface was thermally cleaned at 1250° C. for 10 min under a gas mixture of 12 slm of hydrogen and 1 slm of ammonia.

Then, the temperature of the layer stack was reduced to 1200° C. A 0.1 μm thick AlN buffer layer was grown on the AlN single crystalline layer of the stack layer. The growth condition during the buffer layer growth was as follows: the trimethylaluminum flow rate was 25 μmol/min, the flow rate of ammonia was 1 slm, the total flow rate was 10 slm, and the reactor pressure was 0.05 atm.

Then, the temperature of the layer stack was reduced to 1120° C. A 0.2 μm thick $Al_{0.7}Ga_{0.3}N$ layer was grown under the following growth conditions: the trimethylgallium flow rate was 20 μmol/min, the trimethylaluminum flow rate was 30 μmol/min, the ammonia flow rate was 1.5 slm, the total flow rate was 10 slm, and the reactor pressure was 0.05 atm.

In addition, a 1.2 μm thick n-type $Al_{0.7}Ga_{0.3}N$ buffer layer was grown under the same growth conditions as the 0.2 μm thick $Al_{0.7}Ga_{0.3}N$ layer, while tetraethyl silane was used as n-type dopant and its flow rate was 3 μmol/min during the growth of the 1.2 μm thick $Al_{0.7}Ga_{0.3}N$ layer.

Subsequently, a 2 nm thick $Al_{0.3}Ga_{0.7}N$ well layer was grown under the same growth conditions as the AlN buffer layer, except that the trimethylgallium flow rate was 40 μmol/min and the trimethylaluminum flow rate was 3 μmol/min. Then, a 15 nm thick barrier layer was grown under the same conditions as the buffer layer. By repeating the growth of pairs of these well and barrier layers three times, a triple quantum well structure was formed.

Then, a 20 nm thick p-type $Al_{0.9}Ga_{0.1}N$ layer was grown under the same conditions as the buffer layer, except that the trimethylgallium flow rate was 15 μmol/min and the biscyclopentadienyl magnesium flow rate was 0.8 μmol/min.

Next, a 0.2 μm thick GaN contact layer was formed using the following growth conditions: the trimethylgallium flow rate was 40 μmol/min, bis-cyclopentadienyl magnesium flow rate was 0.8 μmol/min, the ammonia flow rate was 2 slm, the total flow rate was 8 slm, and the reactor pressure was 0.2 atm.

The sample was unloaded from the MOCVD apparatus, and then was thermally treated under nitrogen atmosphere for 20 min and at 800° C.

Next, after a portion of the substrate was etched to expose Si-doped $Al_{0.7}Ga_{0.3}N$ using ICP etching equipment, a Ti (20 nm)/Al(100 nm)/Ti (20 nm)/Au (50 nm) electrode was deposited on the exposed surface by vacuum evaporation and then was thermally annealed under nitrogen atmosphere at 1000° C. for 1 min. Next, a Ni (20 nm)/Au (100 nm) electrode (14) was deposited on the aforementioned p-type GaN contact surface by vacuum evaporation and then thermally treated under nitrogen atmosphere at 500° C. for 5 min.

As a consequence, the light emitting device layer (13) was formed on the surface of the AlN single crystalline layer of the layer stack. Furthermore, the back side of the substrate (i.e., in this practical example, the AlN polycrystal or single crystalline AlN thin film) was removed by mechanical polishing, and thus LEDs were fabricated. The thickness of the light emitting device was about 100 μm. When producing and characterizing this LED, single peaked emission was confirmed at a wavelength of 265 nm. The optical output was 1.3 mW at a current of 20 mA, and the device failure rate was 33%.

PRACTICAL EXAMPLE 2

Production of the Layer Stack (Manufacture of AlN Single Crystalline Layer), and Analytical Evaluation An AlN single crystalline layer deposited on an AlN single crystal substrate was used as a substrate for device fabrication in this study. The AlN single crystalline substrate had a diameter of 18 mm, a thickness of 0.5 mm, an average lattice constant of 0.311098 nm, x-ray rocking curves with a full width at half maximum of 17 arcsec, a dislocation density of $5 \times 10^4$ cm$^{-2}$, and an absorption coefficient of 1200 cm$^{-1}$.

An AlN single crystalline layer was grown on the substrate by using the same equipment and identical growth conditions as detailed in Practical Example 1. There was no cracking observed in the AlN single crystalline layer. The film thickness was 320 μm as measured by cross-sectional scanning electron microscopy. Five measuring locations consisted of the center of the AlN single crystalline layer and another four points located at a radius of 7 mm from the center; these four points were separated by an angle of 90° from each other. The average value of the lattice constant from the five measurements of the lattice constants was 0.311103 nm and $|a_1-a_2|/a_1$ was 16 ppm.

In addition, when inclusions in the AlN single crystalline layers were observed by Nomarski differential interference microscopy, the density of defects originating from inclusions was 2 cm$^{-2}$. The X-ray rocking curves full width at half maximum of the (002) plane was 25 arcsec, and the dislocation density in the AlN single crystalline layer was the same as that in the substrate. Impurity concentrations measured by secondary ion mass spectroscopy (SIMS) were $5 \times 10^{16}$ cm$^{-3}$ for Si, $2 \times 10^{16}$ cm$^{-3}$ for O, $3 \times 10^{16}$ cm$^{-3}$ for C, and $1 \times 10^{15}$ cm$^{-3}$ for B. Therefore, the total impurity concentration, which was mentioned previously, was $1 \times 10^{17}$ cm$^{-3}$.

A freestanding substrate of 114 μm thickness was prepared from the AlN single crystalline layer for spectroscopic ellipsometry in the same manner as in Practical Example 1. When the refractive index was measured and analyzed by the spectroscopic ellipsometer in the same manner as in Practical Example 1, the refractive indices of the a-axis and c-axis directions were 2.391 and 2.491, respectively, and the difference between these refractive indices was 0.100 at a wavelength of 250 nm The anisotropy of the a-axis direction and the c-axis direction was not observed in the extinction coefficient, and the extinction coefficient was 0.000014. The absorption coefficient was calculated from Equation 1 with the extinction coefficient at a wavelength of 250 nm, and it was 7.0 cm$^{-1}$.

In addition, at a wavelength of 265 nm, the refractive index of the a-axis direction was 2.336, the refractive index of the c-axis direction was 2.424, and the refractive index difference between the a-axis direction and the c-axis direction was 0.088. On the other hand, the anisotropy of the a-axis direction and the c-axis direction was not observed, and the extinction coefficient was 0.000014. The absorption coefficient was calculated from Equation 1 with the extinction coefficient at a wavelength of 265 nm, and it was 6.6 cm$^{-1}$. As shown in FIG. 7, no significant absorption was observed in the ultraviolet region from 300 nm to the band edge.

Measurement of Wall Deposits in the Flow Channel

After the growth, in the range of 200 mm upstream to 200 mm downstream of the nozzle tip, quantitative analysis of deposits in the system of the flow channel wall was carried out. After removing the components of the flow channel from the HVPE apparatus, the parts in the above-mentioned range and that were kept below 1200° C. were immersed in 3 liters of an aqueous solution of 1% TMAH for 1 hour. In this case, the container that was used was made of fluorine resin (PFA) and washed with ultrapure water before use. After diluting aforementioned wash solution 50 times, the amount of Al was measured by inductively coupled plasma-optical emission spectrometry, and a concentration of 4.7 ppm was found. Therefore, the Al element content in the deposits on the inner wall of the flow channel, $B_{depo}$, was calculated to be 0.0105 mol.

On the other hand, when estimating the amount of Al supplied to the HVPE equipment, $B_{input}$ was 0.0964 mol because 10.8 sccm hydrogen chloride was supplied for 10 hours, and the total supply of hydrogen chloride was 6480 ml. Therefore, $B_{depo}/B_{input}$ was 11%.

Production and Characterization of LEDs

Next, when producing and characterizing the LEDs in the same manner as in Practical Example 1, single peak emission was confirmed at a wavelength of 265 nm. An optical output of 1.4 mW was achieved at a current of 20 mA, and the device failure rate was 18%.

PRACTICAL EXAMPLE 3

Production of the Layer Stack (Manufacture of AlN Single Crystalline Layer), and Analytical Evaluation The same substrate as used in Practical Example 2 was used. The growth temperature of the AlN single crystalline layer was 1350° C. With the exception that the supply flow rate of hydrogen chloride was 12 sccm and the partial pressures of aluminum chloride and ammonia were 0.0004 atm and 0.0032 atm, respectively, AlN single crystalline layers were grown by using the same equipment and the same growth conditions as in Practical Example 1. There was no cracking observed in the AlN single crystalline layer. The thickness was 240 μm as measured by cross-sectional scanning electron microscopy. Five measuring locations consisted of the center of the AlN single crystalline layer and another four points located at a radius of 7 mm from the center. These four points were separated by an angle of 90° between each other. The average value of the lattice constant from these five measurements was 0.311102 nm and $|a_1-a_2|/a_1$ was 13 ppm.

In addition, when inclusions in AlN single crystalline layers were observed by Nomarski differential interference microscopy, the density of defects originating from inclusions was 15 cm$^{-2}$. X-ray rocking curves of the (002) plane had a FWHM of 103 arcsec ,and the dislocation density in the AlN single crystalline layer was the same as that in the substrate. Impurity concentrations measured by secondary ion mass spectroscopy (SIMS) were 7×10$^{16}$ cm$^{-3}$ for Si, 2×10$^{17}$ cm$^{-3}$ for O, 3×10$^{16}$ cm$^{-3}$ for C, and 1×10$^{15}$ cm$^{-3}$ for B. Therefore, the total impurity concentration, which was mentioned previously, was 3×10$^{17}$ cm$^{-3}$.

A freestanding substrate of 120 μm thickness was prepared from the AlN single crystalline layer for spectroscopic ellipsometry in the same manner as in Practical Example 1. When the refractive index was measured and analyzed by the spectroscopic ellipsometer in the same manner as in Practical Example 1, the refractive indices of the a-axis and c-axis directions were 2.385 and 2.478, respectively, and the difference between these refractive indices was 0.093 at a wavelength of 250 nm. The anisotropy of the a-axis direction and the c-axis direction was not observed in the extinction coefficient, and the extinction coefficient was 0.000019. The absorption coefficient was calculated from Equation 1 with the extinction coefficient at a wavelength of 250 nm, and it was 9.6 cm$^{-1}$.

In addition, at a wavelength of 265 nm, the refractive index of the a-axis direction was 2.329, the refractive index of the c-axis direction was 2.409, and the refractive index difference between the a-axis direction and the c-axis direction was 0.080. On the other hand, the anisotropy of the a-axis direction and the c-axis direction was not observed, and the extinction coefficient was 0.000019. The absorption coefficient was calculated from Equation 1 with the extinction coefficient at a wavelength of 265 nm, and it was 9.0 cm$^{-1}$. No significant absorption was observed in the ultraviolet region from 300 nm to the band edge.

Measurement of Deposits on the Wall Surface of the Flow Channel

In the same manner as in Practical Example 1, when the temperature at the quartz glass flow channel was measured by contacting it with a thermocouple during a test experiment, i.e., not during growth, the temperature was below 1200° C. at a position of 14 mm away from the outer circumference of the 50 mm diameter susceptor. The flow channel right above the susceptor was at 970° C. The temperature monotonically decreased to 390° C. at 200 mm upstream from the nozzle tip, and it also monotonically decreased to 305° C. 200 mm downstream from the nozzle tip. In addition, the temperature at the tip of the nozzle was 680° C., and the nozzle temperature monotonically decreased to 395° C. at 200 mm upstream from the nozzle tip.

After the growth, in the range of 200 mm upstream as well as 200 mm downstream from the nozzle tip, quantitative analysis of wall deposits in the system of the flow channel was carried out. After removing the components of the flow channel from the HVPE apparatus, the parts in the aforementioned range and which were kept below 1200° C. were immersed in 3 liters of an aqueous solution of 1% TMAH for 1 hour. In this case, the container that was used was made of fluorine resin (PFA) and washed with ultrapure water before use. After diluting aforementioned wash solution 50 times, the amount of Al was measured by inductively coupled plasma-optical emission spectrometry, and a concentration of 5.1 ppm was found. Therefore, the Al element content in the deposits on the inner wall of the flow channel, $B_{depo}$, was calculated to be 0.0284 mol.

On the other hand, when estimating the amount of Al supplied to the HVPE equipment, $B_{input}$ was 0.1071 mol because 12 sccm hydrogen chloride was supplied for 10 hours, and the total supply of hydrogen chloride was 7200 ml. Therefore, $B_{depo}/B_{input}$ was 26%.

Production and Characterization of LEDs

Next, when producing and characterizing the LEDs in the same manner as in Practical Example 1, single peak emission was confirmed at a wavelength of 265 nm. An optical output of 1.2 mW at a current of 20 mA was measured, and the device failure rate was 39%.

PRACTICAL EXAMPLE 4

Production and Analytical Characterization of the Stack Layer (Manufacture of AlN Single Crystalline Layer)

The same substrate as used in Practical Example 2 was used. The growth temperature of the AlN single crystalline layer was 1540° C. Except for the use of a TaC coated graphite susceptor for this study, the AlN single crystalline layer was grown using the same equipment and growth conditions as in Practical Example 1. There was no cracking observed in the AlN single crystalline layer. The thickness was 340 μm as measured by cross-sectional scanning electron microscopy. Five measurement locations consisted of the center of the AlN single crystalline layer and four additional points located at a radius of 7 mm from the center. These four points were separated by an angle of 90° between each other. The average value of the lattice constant from the five measurements of the lattice constants was 0.311093 nm and $|a_1-a_2|/a_1$ was 16 ppm.

In addition, when inclusions in the AlN single crystalline layer were observed by Nomarski differential interference microscopy, the density of defects was 1 cm$^{-2}$. X-ray rocking curves of the (002) plane had a FWHM of 32 arcsec, and the dislocation density in AlN single crystalline layer was the same as that in the substrate. Impurity concentrations measured by secondary ion mass spectroscopy (SIMS) were $2\times10^{17}$ cm$^{-3}$ for Si, $3\times10^{17}$ cm$^{-3}$ for O, $2.5\times10^{18}$ cm$^{-3}$ for C, and below the detection limit for B. Therefore, the total impurity concentration, which was mentioned previously, was $3\times10^{18}$ cm$^{-3}$.

A freestanding AlN single crystalline layer of 160 μm thickness was prepared for spectroscopic ellipsometry in the same manner as in Practical Example 1.

When the refractive index was measured and analyzed by the spectroscopic ellipsometer in the same manner as in Practical Example 1, the refractive indices of the a-axis and c-axis directions were 2.382 and 2.492, respectively, and the difference between these refractive indices was 0.110 at a wavelength of 250 nm. The anisotropy of the a-axis direction and the c-axis direction was not observed in the extinction coefficient, and the extinction coefficient was 0.000026. The absorption coefficient was calculated from the Equation 1 with the extinction coefficient at a wavelength of 250 nm, and it was 13 cm$^{-1}$.

In addition, at a wavelength of 265 nm, the refractive index of the a-axis direction was 2.326, the refractive index of the c-axis direction was 2.422, and the refractive index difference between the a-axis direction and the c-axis direction was 0.096. On the other hand, the anisotropy of the a-axis direction and the c-axis direction was not observed, and the extinction coefficient was 0.000021. The absorption coefficient was calculated from Equation 1 with the extinction coefficient at a wavelength of 265 nm, and it was 10 cm$^{-1}$. No significant absorption was observed in the ultraviolet region from 300 nm to the band edge.

Measurement of Deposits on the Wall Surface of the Flow Channel

In the same manner as in Practical Example 1, when the temperature at the quartz glass flow channel was measured by contacting it with a thermocouple during a test experiment, i.e., not during growth, the temperature was below 1200° C. at a position 18 mm away from the outer circumference of the 50 mm diameter susceptor. The flow channel right above the susceptor was at 1060° C. Temperature monotonically decreased to 420° C. at 200 mm upstream from the nozzle tip, and it also monotonically decreased to 335° C. at 200 mm downstream from the nozzle tip. In addition, the temperature at the tip of the nozzle was 730° C., and the nozzle temperature monotonically decreased to 418° C. at 200 mm upstream from the nozzle tip.

After the growth, in the range of 200 mm upstream as well as 200 mm downstream from the nozzle tip, quantitative analysis of wall deposits in the system of the flow channel was carried out. After removing the components of the flow channel from the HVPE apparatus, the parts in the aforementioned range and which were below 1200° C. were immersed in 3 liters of an aqueous solution of 1% TMAH for 1 hour. In this case, the container that was used was made of fluorine resin (PFA) and washed with ultrapure water before use. After diluting aforementioned wash solution 20 times, the amount of Al was measured by inductively coupled plasma-optical emission spectrometry, and a concentration of 2.2 ppm was found. Therefore, the Al element content in the deposits on the inner wall of the flow channel, $B_{depo}$, was calculated to be 0.0049 mol.

On the other hand, when estimating the amount of Al supplied to the HVPE equipment, $B_{input}$ was 0.1071 mol because 10.8 sccm hydrogen chloride was supplied for 10 hours, and the total supply of hydrogen chloride was 6480 ml. Therefore, $B_{depo}/B_{input}$ was 5%.

Production and Characterization of LEDs

Next, when producing and characterizing the LEDs in the same manner as in Practical Example 1, single peak emission was confirmed at a wavelength of 265 nm. An optical output of 1.1 mW was measured at a current of 20 mA and the device failure rate was 26%.

COMPARATIVE EXAMPLE 1

The same substrate as in Practical Example 2 was used here. Except for the use of no baffle plate for this study, AlN single crystalline layers were grown by using the same equipment and growth conditions as in Practical Example 1. There was no cracking in the AlN single crystalline layer. The thickness was 290 μm as measured by cross-sectional scanning electron microscopy. Five measuring locations consisted of the center of the AlN single crystalline layer and four additional points located at a radius of 7 mm from the center. These four points were separated by an angle of 90° between each other. The average value of the lattice constant from a total of five measurements was 0.311070 nm and $|a_1-a_2|/a_1$ was 90 ppm.

In addition, when inclusions in AlN single crystalline layers were observed by Nomarski differential interference microscopy, the density of defects originating from inclusions was 80 cm$^{-2}$. X-ray rocking curves of the (002) plane had FWHM of 240 arcsec, and the dislocation density in the AlN single crystalline layer was the same as that in the substrate. Impurity concentrations measured by secondary ion mass spectroscopy (SIMS) were $1\times10^{17}$ cm$^{-3}$ for Si, $1\times10^{17}$ cm$^{-3}$ for O and below the detection limit for C and B. Therefore, the total impurity concentration, which was mentioned previously, was $2\times10^{17}$ cm$^{-3}$.

A freestanding AlN single crystalline layer of 180 μm thickness was prepared for spectroscopic ellipsometry in the same manner as in Practical Example 1. When the refractive index was measured and analyzed by the spectroscopic ellipsometer in the same manner as in Practical Example 1, the refractive indices of the a-axis and c-axis directions were 2.293 and 2.341, respectively, and the difference between these refractive indices was 0.048 at a wavelength of 250 nm. The anisotropy of the a-axis direction and the c-axis direction was not observed in the extinction coefficient, and the extinction coefficient was 0.000022. The absorption coefficient was calculated from the Equation 1 with the extinction coefficient at a wavelength of 250 nm, and it was 13 cm$^{-1}$.

In addition, at a wavelength of 265 nm, the refractive index of the a-axis direction was 2.241, the refractive index of the c-axis direction was 2.280, and the refractive index difference between the a-axis direction and the c-axis direction was 0.039. On the other hand, the anisotropy of the a-axis direction and the c-axis direction was not observed, and the extinction coefficient was 0.000021. The absorption coefficient was calculated from Equation 1 with the extinction coefficient at a wavelength of 265 nm, and it was 10 cm$^{-1}$. No significant absorption was observed in the ultraviolet region from 300 nm to the band edge.

Measurement of Deposits on the Wall Surface of the Flow Channel

After the growth, in the range of 200 mm upstream as well as 200 mm downstream from the nozzle tip, quantitative analysis of wall deposits in the system of the flow channel was carried out. After removing the components of the flow channel from the HVPE apparatus, the parts in the aforementioned range and which were kept below 1200° C. were immersed in 3 liters of an aqueous solution of 1% TMAH for 1 hour. In this case, the container that was used was made of fluorine resin (PFA) and washed with ultrapure water before use. After diluting aforementioned wash solution 20 times, the amount of Al was measured by inductively coupled plasma-optical emission spectrometry, and a concentration of 3.1 ppm was found. Therefore, the Al element content in the deposits on the inner wall of the flow channel, $B_{depo}$, was calculated to be 0.0345 mol.

On the other hand, when estimating the amount of Al supplied to the HVPE equipment, $B_{input}$ was 0.0946 mol because 10.8 sccm hydrogen chloride was supplied for 10 hours, and the total supply of hydrogen chloride was 6480 ml. Therefore, $B_{depo}/B_{input}$ was 36%.

Production and Characterization of LEDs

Next, when producing and characterizing the LEDs in the same manner as in Practical Example 1, single peak emission was confirmed at a wavelength of 265 nm. An optical output of 0.7 mW was measured at a current of 20 mA, and the device failure rate was 74%.

COMPARATIVE EXAMPLE 2

Production and Analytical Characterization of the Layer Stack (Fabrication of AlN Single Crystalline Layer)

The same substrate as used in Practical Example 2 was used. An HVPE apparatus with no baffle plate was used for this study. The substrate was heated to 1100° C. by external heating around the susceptor. Furthermore, except that the supply flow rate of hydrogen chloride was 6 sccm and the partial pressure of aluminum chloride and ammonia were 0.0002 atm and 0.002 atm, respectively, during a growth time of 12 hr, the AlN single crystalline layer was grown by using the same equipment and the same growth conditions as in Practical Example 1. There was no cracking observed in the AlN single crystalline layer. The thickness was 120 μm as measured by cross-sectional scanning electron microscopy. Five measuring locations consisted of the center of the AlN single crystalline layer and four additional points were located at a radius of 7 mm from the center. These four points were separated by an angle of 90° between each other. The average value of the lattice constant from these five measurements was 0.311062 nm and $|a_1-a_2|/a_1$ was 116 ppm.

In addition, when inclusions in the AlN single crystalline layer were observed by Nomarski differential interference microscopy, the density of defects originating from inclusions was 100 cm$^{-2}$. X-ray rocking curves of the (002) plane had a FWHM of 3200 arcsec, and the dislocation density in the AlN single crystalline layer was the same as that in the substrate Impurity concentrations measured by secondary ion mass spectroscopy (SIMS) were $2\times10^{16}$ cm$^{-3}$ for Si, $3\times10^{16}$ cm$^{-3}$ for O and below the detection limit for C and B. Therefore, the total impurity concentration, which was mentioned previously, was $5\times10^{16}$ cm$^{-3}$.

A freestanding AlN single crystalline layer of 72 μm thickness was prepared for spectroscopic ellipsometry in the same manner as in Practical Example 1. When the refractive index was measured and analyzed by the spectroscopic ellipsometer in the same manner as Practical Example 1, the refractive indices of the a-axis c-axis directions were 2.251 and 2.289, respectively, and the difference between these refractive indexes was 0.038 at a wavelength of 250 nm. The anisotropy of the a-axis direction and the c-axis direction was not observed in the extinction coefficient, and the extinction coefficient was 0.000012. The absorption coefficient was calculated from Equation 1 with the extinction coefficient at a wavelength of 250 nm, and it was 60 cm$^{-1}$.

In addition, at a wavelength of 265 nm, the refractive index of the a-axis direction was 2.216, the refractive index of the c-axis direction was 2.247, and the refractive index difference between the a-axis direction and the c-axis direction was 0.031. On the other hand, the anisotropy of the a-axis direction and the c-axis direction was not observed, and the extinction coefficient was 0.00010. The absorption coefficient was calculated from the Equation 1 with the extinction coefficient at a wavelength of 265 nm, and it was 47 cm$^{-1}$.

Measurement of Deposits on the Wall Surface of the Flow Channel

In the same manner as in Practical Example 1, when the temperature at the quartz glass flow channel was measured by contacting a thermocouple during the test experiment, i.e., not during growth, the temperature was below 1200° C. in the whole region of the flow channel. The flow channel right above the susceptor was 1100° C. Temperature monotonically decreased to 630° C. at 200 mm upstream from the nozzle tip, and it also monotonically decreased to 900° C. at 200 mm downstream from the nozzle tip. In addition, the temperature at the tip of the nozzle was 1080° C., and the nozzle temperature monotonically decreased to 680° C. 200 mm upstream from the nozzle tip.

After the growth, in the range of 200 mm upstream as well as 200 mm downstream from the nozzle tip, quantitative analysis of wall deposits in the system of the flow channel was carried out. After removing the components of the flow channel from the HVPE apparatus, the parts in the aforementioned range and which were kept below 1200° C. were immersed in 3 liters of an aqueous solution of 1% TMAH for 1 hour. In this case, the container that was used was made of fluorine resin (PFA) and washed with ultrapure water before use. After diluting the aforementioned wash solution 20 times, the amount of Al was measured by inductively coupled plasma-optical emission spectrometry, and a concentration of 4.8 ppm was found. Therefore, the Al element content in the deposits on the inner wall of the flow channel, $B_{depo}$, was calculated to be 0.0267 mol.

On the other hand, when estimating the amount of Al supplied to the HVPE equipment, $B_{input}$ was 0.0536 mol, because 6 sccm hydrogen chloride was supplied for 10 hours, and the total supply of hydrogen chloride was 3600 ml. Therefore, $B_{depo}/B_{input}$ was 50%.

Production and Characterization of LEDs

Next, when producing and characterizing the LEDs in the same manner as in Practical Example 1, single peak emission was confirmed at a wavelength of 265 nm. An optical output of 0.2 mW was measured at a current of 20 mA and the device failure rate was 90%.

COMPARATIVE EXAMPLE 3

Production and Analytical Characterization of the Stack Layer (Fabrication of AlN Single Crystalline Layer)

The same substrate as in Practical Example 2 was used here. Except that the supply flow rate of hydrogen chloride was 12 sccm, a graphite susceptor was used, and the partial pressures of aluminum chloride and ammonia were 0.0004 atm and 0.0016 atm, respectively, during a growth time of 12 hr, AlN single crystalline layers were grown by using the same equipment and growth conditions as in Practical Example 1. There was no cracking observed in the AlN single crystalline layer. The thickness was 250 μm as measured the cross-sectional scanning electron microscopy. Five measurement locations consisted of the center of the AlN single crystalline layer and four additional points located at a radius of 7 mm from the center. These four points were separated by an angle of 90° between each other. The average value of the lattice constant from five measurements was 0.311080 nm and $|a_1-a_2|/a_1$ was 58 ppm.

In addition, when inclusions in AlN single crystalline layers were observed by Nomarski differential interference microscopy, the density of defects resulting from inclusions was 2 $cm^{-2}$. X-ray rocking curves of the (002) plane were 65 arcsec, and the dislocation density in the AlN single crystalline layer was the same as that in the substrate. Impurity concentrations measured by secondary ion mass spectroscopy (SIMS) were $1\times10^{17}$ $cm^{-3}$ for Si, $1\times10^{17}$ $cm^{-3}$ for O, $3\times10^{19}$ $cm^{-3}$ for C and below the detection limit for B. Therefore, the total impurity concentration, which was mentioned previously, was $3\times10^{19}$ $cm^{-3}$.

A freestanding AlN single crystalline layer of 135 μm thickness was prepared for spectroscopic ellipsometry in the same manner as in Practical Example 1. When the refractive index was measured and analyzed by the spectroscopic ellipsometer in the same manner as in Practical Example 1, the refractive indices of the a-axis and c-axis directions were 2.411 and 2.474, respectively, and the difference between these refractive indices was 0.063 at a wavelength of 250 nm. The anisotropy of the a-axis direction and the c-axis direction was not observed in the extinction coefficient, and the extinction coefficient was 0.00534. The absorption coefficient was calculated from Equation 1 with the extinction coefficient at a wavelength of 250 nm, and it was 2722 $cm^{-1}$.

In addition, at a wavelength of 265 nm, the refractive index of the a-axis direction was 2.366, the refractive index of the c-axis direction was 2.425, and the refractive index difference between the a-axis direction and the c-axis direction was 0.059. On the other hand, the anisotropy of the a-axis direction and the c-axis direction was not observed, and the extinction coefficient was 0.00348. The absorption coefficient was calculated from Equation 1 with the extinction coefficient at a wavelength of 265 nm, and it was 1650 $cm^{-1}$.

Measurement of Deposits on the Surface of the Flow Channel

After the growth, in the range of 200 mm upstream as well as 200 mm downstream from the nozzle tip, quantitative analysis of wall deposits in the system of the flow channel was carried out. After removing the components of the flow channel from the HVPE apparatus, the parts in the aforementioned range and which were kept below 1200° C. were immersed in 3 liters of an aqueous solution of 1% TMAH with for 1 hour. In this case, the container that was used was made of fluorine resin (PFA) and washed with ultrapure water before use. After diluting the aforementioned wash solution 50 times, the amount of Al was measured by inductively coupled plasma-optical emission spectrometry, and a concentration of 4.5 ppm was found. Therefore, the Al element content in the deposits on the inner wall of the flow channel, $B_{depo}$, was calculated to be 0.0250 mol.

On the other hand, when estimating the amount of Al supplied to the HYPE equipment, $B_{input}$ was 0.1071 mol because 12 sccm hydrogen chloride was supplied for 10 hours, and the total supply of hydrogen chloride was 7200 ml. Therefore, $B_{depo}/B_{input}$ was 23%.

Production and Characterization of LEDs

Next, when producing and characterizing the LEDs in the same manner as in Practical Example 1, single peak emission was confirmed at a wavelength of 265 nm. An optical output of 0.01 mW was measured at a current of 20 mA and the device failure rate was 31%. Since the ultraviolet light transparency of this AlN single crystalline layer was insufficient, it was thought that the AlN single crystalline layer absorbed the emitted light.

A summary of LED performance for all Practical Examples and Comparative Examples is set forth in Table 1 below.

TABLE 1

|  | Failure Rate % | LED Output mW |
|---|---|---|
| Practical Example 1 | 33 | 1.3 |
| Practical Example 2 | 18 | 1.4 |
| Practical Example 3 | 39 | 1.2 |
| Practical Example 4 | 26 | 1.1 |
| Comparative Example 1 | 74 | 0.7 |
| Comparative Example 2 | 90 | 0.2 |
| Comparative Example 3 | 31 | 0.01 |

Many modifications and other aspects of the disclosure set forth herein will come to mind to one skilled in the art to which the disclosure pertains having the benefit of the teachings presented in the foregoing descriptions and the associated drawings. Therefore, it is to be understood that the disclosure is not to be limited to the specific aspects disclosed and that modifications and other aspects are intended to be included within the scope of the appended claims. Although specific terms are employed herein, they are used in a generic and descriptive sense only and not for purposes of limitation.

Reference numbers in drawings are as follows:
11. (Base) substrate
12. Highly transparent single crystalline AlN layer
13. Light emitting device layer
14. P-type electrode
15. N-type electrode
31. (Base) substrate
32. Flow channel
33. Susceptor
34. Local heating arrangement
35. External heating arrangement
36. Supply nozzle for aluminum chloride
37. Supply nozzle for nitrogen precursor gas
38. Exhaust port
39. Chamber
40. Baffle plate

What is claimed is:

1. A highly transparent single crystalline AlN layer having a refractive index in the a-axis direction in the range of 2.250 to 2.400 and an absorption coefficient less than or equal to 15 $cm^{-1}$ at a wavelength of 265 nm.

2. The highly transparent single crystalline AlN layer of claim 1, the single crystalline AlN layer having a refractive index in the c-axis direction larger than the refractive index in the a-axis direction, wherein the difference between the refractive indices is in the range of 0.05 to 0.15 at a wavelength of 265 nm.

3. The highly transparent single crystalline AlN layer of claim 1, the single crystalline AlN layer having a density of defects, originating from inclusions with maximum outer diameter ranging from 1 to 200 µm, of less than or equal to 50 $cm^{-2}$, and wherein the principal surface area is larger than or equal to 100 $mm^2$, and wherein the thickness of the single crystalline AlN layer ranges from 0.05 to 2.0 mm.

4. The highly transparent single crystalline AlN layer of claim 1, wherein the sum of Si, O, C, and B impurity concentrations is less than or equal to $1 \times 10^{19}$ $cm^3$.

5. The highly transparent single crystalline AlN layer of claim 1, wherein said layer is formed by hydride vapor phase epitaxy.

6. A stack of layers comprising at least one highly transparent single crystalline AlN layer according to claim 1, which is deposited on a base substrate with an AlN single crystalline surface.

7. The stack of layers of claim 6, where the average lattice constant of the AlN single crystalline substrate and that of the at least one highly transparent single crystalline AlN layer are represented by $a_1$ and $a_2$, respectively, and wherein the value indicated by is $|a_1-a_2|/a_1$ less than or equal to 90 ppm.

8. A light emitting diode (LED) comprising a highly transparent single crystalline AlN layer according to claim 1 as a device substrate.

9. A method for growing highly transparent single crystalline AlN layers, comprising:
supplying an aluminum chloride gas from a supply nozzle and a nitrogen precursor gas from a supply nozzle to a reactor having walls, wherein a portion of the walls of the reactor form a flow channel segment defined as the walls of the reactor from 200 mm upstream to 200 mm downstream of the location of a tip of the aluminum chloride gas supply nozzle; and
reacting the aluminum chloride gas with the nitrogen precursor gas on a substrate in the reactor in order to grow an AlN single crystalline layer on the substrate; and
supplying a carrier gas to the flow channel of the reactor and directing the carrier gas toward the substrate, the carrier gas being supplied around the supply nozzles for the aluminum chloride gas and the nitrogen precursor gas, wherein the carrier gas passes through a baffle plate comprising a plurality of holes;
wherein, during the reacting step, the amount of aluminum contained in wall deposits formed in the flow channel segment is maintained at a level lower than or equal to 30% of the total amount of aluminum fed into the reactor, and wherein the wall temperature in the flow channel is maintained at less than or equal to 1200° C.

* * * * *